United States Patent
Tsuchiya et al.

(10) Patent No.: US 11,939,491 B2
(45) Date of Patent: Mar. 26, 2024

(54) METHOD OF POLISHING OBJECT TO BE POLISHED CONTAINING MATERIAL HAVING SILICON-SILICON BOND

(71) Applicant: FUJIMI INCORPORATED, Kiyosu (JP)

(72) Inventors: Kohsuke Tsuchiya, Kiyosu (JP); Maki Asada, Kiyosu (JP); Satoshi Momota, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 126 days.

(21) Appl. No.: 17/441,587

(22) PCT Filed: Jan. 30, 2020

(86) PCT No.: PCT/JP2020/003548
§ 371 (c)(1),
(2) Date: Sep. 21, 2021

(87) PCT Pub. No.: WO2020/195149
PCT Pub. Date: Oct. 1, 2020

(65) Prior Publication Data
US 2022/0186077 A1  Jun. 16, 2022

(30) Foreign Application Priority Data
Mar. 27, 2019  (JP) ................................. 2019-061177
Mar. 27, 2019  (JP) ................................. 2019-061187

(51) Int. Cl.
*C09G 1/02* (2006.01)
*H01L 21/306* (2006.01)

(52) U.S. Cl.
CPC .......... *C09G 1/02* (2013.01); *H01L 21/30625* (2013.01)

(58) Field of Classification Search
None
See application file for complete search history.

(56) References Cited

U.S. PATENT DOCUMENTS

2019/0061095 A1  2/2019  Takami et al.

FOREIGN PATENT DOCUMENTS

| CN | 106463386 A | 2/2017 |
|----|-------------|--------|
| CN | 108713242 A | 10/2018 |
| EP | 3 159 915 A1 | 4/2017 |
| EP | 3159915 A1 * | 4/2017 |
| EP | 3 258 483 A1 | 12/2017 |
| JP | 2011-097045 A | 5/2011 |
| JP | 2015-124231 A | 7/2015 |
| JP | 2016-004953 A | 1/2016 |
| JP | 2019-021719 A | 2/2019 |
| TW | 201608630 A | 3/2016 |

OTHER PUBLICATIONS

Office Action issued in corresponding Taiwanese Patent Application No. 109104513 dated May 23, 2023 (23 pages).
EP Supplementary Search Report on EP Appl. Ser. No. 20 77 9911 dated Mar. 25, 2022 (11 pages).
CN Office on non-Foley case related to US (CN Appl. Ser. No. 202080023899.2) dated Aug. 5, 2022, with translation (21 pages).
Office Action issued in corresponding Chinese Application No. 202080023899.2 dated Dec. 31, 2021 with English translation.
Office Action issued in corresponding Chinese Patent Application No. 202080023899.2 dated Jan. 6, 2023 (17 pages).
Office Action of corresponding Singapore Patent Application No. 11202110380W, dated Feb. 20, 2023 (9 pages).
JP Office Action for Japanese Patent Application No. 2021-508156 dated Dec. 26, 2023 (9 pages).

* cited by examiner

Primary Examiner — Stephanie P Duclair
(74) Attorney, Agent, or Firm — FOLEY & LARDNER LLP

(57) ABSTRACT

The present invention provides means capable of achieving both a reduction in the number of defects and a reduction in haze in an object to be polished after polishing at a high level in a method of polishing the object to be polished containing a material having a silicon-silicon bond. The present invention relates to a method of polishing an object to be polished containing a material having a silicon-silicon bond, and the polishing method includes a final polishing step $P_f$. In this polishing method, the final polishing step $P_f$ has a plurality of polishing sub-steps, the plurality of polishing sub-steps are continuously performed on the same polishing platen, a final polishing sub-step in the plurality of polishing sub-steps is a polishing sub-step $P_{ff}$ of polishing using a polishing composition $S_{ff}$, a polishing sub-step provided before the polishing sub-step $P_{ff}$ in the plurality of polishing sub-steps is a polishing sub-step $P_{fp}$ of polishing using a polishing composition $S_{fp}$, and the polishing composition $S_{ff}$ satisfies at least one of the following condition (A) or the following condition (B): condition (A): a value of a haze parameter of the polishing composition $S_{ff}$ obtained in a standard test 1 is smaller than a value of the haze parameter of the polishing composition $S_{fp}$ obtained in the standard test 1, and condition (B): the polishing composition $S_{ff}$ contains an abrasive $A_{ff}$, a basic compound $B_{ff}$, and hydroxyethyl cellulose.

12 Claims, No Drawings

METHOD OF POLISHING OBJECT TO BE POLISHED CONTAINING MATERIAL HAVING SILICON-SILICON BOND

TECHNICAL FIELD

The present invention relates to a method of polishing an object to be polished containing a material having a silicon-silicon bond.

BACKGROUND ART

An object to be polished containing a material having a silicon-silicon bond, such as a silicon wafer, is widely used in the semiconductor field and the like. In recent years, with increasing integration of integrated circuits and the like, semiconductor devices have become finer, and a request level related to surface quality has further increased for an object to be polished containing a material having a silicon-silicon bond, so that various techniques related to polishing compositions and polishing methods have been proposed for the purpose of improving surface quality.

As such a technique, JP 2015-124231 A discloses that a polishing composition containing an abrasive, hydroxyethyl cellulose having specific physical properties, and water enhances wettability of a wafer to be polished and, at the same time, can reduce surface defects.

SUMMARY OF INVENTION

The technique according to JP 2015-124231 A suppresses a reduction in surface quality such as an increase in the number of defects and haze that occurs when a water-soluble polymer that functions as a wetting agent such as hydroxyethyl cellulose is added to a polishing composition.

However, the technique according to JP 2015-124231 A has a problem that it is not sufficiently effective in achieving a high level of surface quality satisfying recent demands, especially from the viewpoint of reducing the number of defects.

Thus, an object of the present invention is to provide means capable of achieving both a reduction in the number of defects and a reduction in haze in an object to be polished after polishing at a high level in a method of polishing the object to be polished containing a material having a silicon-silicon bond.

The above problems can be solved by the following means;

a method of polishing an object to be polished containing a material having a silicon-silicon bond, the polishing method including a final polishing step $P_f$, in which the final polishing step $P_f$ has a plurality of polishing sub-steps, the plurality of polishing sub-steps are continuously performed on the same polishing platen, a final polishing sub-step in the plurality of polishing sub-steps is a polishing sub-step $P_{ff}$ of polishing using a polishing composition $S_{ff}$, a polishing sub-step provided before the polishing sub-step $P_{ff}$ in the plurality of polishing sub-steps is a polishing sub-step $P_{fp}$ of polishing using a polishing composition $S_{fp}$, and the polishing composition $S_{ff}$ satisfies at least one of the following condition (A) or the following condition (B):

condition (A): a value of a haze parameter of the polishing composition $S_{ff}$ obtained in a standard test 1 described later is smaller than a value of the haze parameter of the polishing composition $S_{fp}$ obtained in the standard test 1, and condition (B): the polishing composition $S_{ff}$ contains an abrasive $A_{ff}$, a basic compound $B_{ff}$, and hydroxyethyl cellulose.

Furthermore, the above problems can be solved by the following means;

a polishing composition set including a polishing composition $S_{ff}$ or its concentrate used in a final polishing sub-step $P_{ff}$ in a final polishing step $P_f$ and a polishing composition $S_{fp}$ or its concentrate used in a polishing sub-step $P_{fp}$ provided before the polishing sub-step $P_{ff}$, in which the polishing composition $S_{ff}$ or its concentrate satisfies at least one of the following condition (A) or the following condition (B):

condition (A): a value of a haze parameter of the polishing composition $S_{ff}$ obtained in a standard test 1 described later is smaller than a value of the haze parameter of the polishing composition $S_{fp}$ obtained in the standard test 1, and condition (B): the polishing composition $S_{ff}$ or its concentrate contains an abrasive $A_{ff}$, a basic compound $B_{ff}$, and hydroxyethyl cellulose.

Here, the standard test 1 means a test consisting of a pre-polishing step in which the object to be polished is subjected to single side polishing, using a polishing composition C prepared by mixing in deionized water so that a content of colloidal silica having an average primary particle diameter of 35 nm by a BET method is 0.95% by weight and a content of potassium hydroxide is 0.065% by weight, using a polishing pad in which a non-woven base material is impregnated with a polyurethane resin, under conditions in which a polishing load is 19 kPa, a platen rotation speed is 32 rpm, a head rotation speed is 30 rpm, a supply flow rate of the polishing composition C is 1.0 L/min, a polishing time is 160 seconds, a temperature of platen cooling water is 20° C., a holding temperature of the polishing composition C is 20° C., and the polishing composition C is continuously supplied, a post-polishing step in which the object to be polished after the polishing processing by the pre-polishing step is subjected to single side polishing, using the polishing composition $S_{fp}$ and the polishing composition $S_{ff}$ respectively, on a polishing platen different from the polishing platen in the pre-polishing step, using a suede type polishing pad, under conditions in which the polishing load is 16 kPa, the platen rotation speed and the head rotation speed are 30 rpm, the supply flow rate of the polishing composition $S_{fp}$ and the polishing composition $S_{ff}$ is 2.0 L/min, the polishing time is 160 seconds, the temperature of platen cooling water is 20° C., the holding temperature of the polishing composition $S_{fp}$ and the polishing composition $S_{ff}$ is 20° C., and the polishing composition $S_{fp}$ and the polishing composition $S_{ff}$ are continuously supplied, a cleaning process in which the object to be polished after the polishing processing by the post-polishing step is subjected to cleaning processing in which in a state where an ultrasonic oscillator is operated, the object to be polished is immersed and cleaned for 6 minutes in a cleaning solution of 40° C. or more and 80° C. or less prepared by mixing in a volume ratio of 29% by weight concentration of ammonia water:31% by weight concentration of hydrogen peroxide solution:deionized water=2:5.4:20, and the object to be polished is immersed in the deionized water in the state where the ultrasonic oscillator is operated, and then dried, and an evaluation in which a haze parameter of the object to be polished after the cleaning processing is evaluated. Details of the haze parameter obtained in the standard test 1 will be described later.

DESCRIPTION OF EMBODIMENTS

Hereinafter, embodiments of the present invention will be described. The present invention is not limited to only the following embodiments. In the present specification, a range "X to Y" means "not less than X and not more than Y". The operation and measurements of the physical properties and the like are conducted under conditions of room temperature (range of 20° C. or more and 25° C. or less)/relative humidity 40% RH or more and 50% RH or less, unless otherwise specified.

<Polishing Method>

An embodiment of the present invention relates to a method of polishing an object to be polished containing a material having a silicon-silicon bond, the polishing method including a final polishing step $P_f$, in which the final polishing step $P_f$ has a plurality of polishing sub-steps, the plurality of polishing sub-steps are continuously performed on the same polishing platen, a final polishing sub-step in the plurality of polishing sub-steps is a polishing sub-step $P_{ff}$ of polishing using a polishing composition $S_{ff}$, the polishing sub-step provided before the polishing sub-step $P_{ff}$ in the plurality of polishing sub-steps is a polishing sub-step $P_{fp}$ of polishing using the polishing composition $S_{fp}$, and a value of a haze parameter of the polishing composition $S_{ff}$ obtained in a standard test 1 is smaller than a value of the haze parameter of the polishing composition $S_{fp}$ obtained in the standard test 1 (that is, the above condition (A) is satisfied). According to one embodiment of the present invention, there is provided means capable of achieving both a reduction in the number of defects and a reduction in haze in an object to be polished after polishing at a high level in a method of polishing the object to be polished containing a material having a silicon-silicon bond.

The present inventors speculate the mechanism by which the above-mentioned problems can be solved by the embodiment as follows.

In one embodiment of the present invention, the value of the haze parameter of the polishing composition used in the final polishing sub-step $P_{ff}$ of the final polishing step $P_f$ is smaller than the value of the haze parameter of the polishing composition used in the polishing sub-step $P_{fp}$ provided before the polishing sub-step $P_{ff}$ of the final polishing step $P_f$, so that the haze is reduced. Here, the polishing composition in which the value of the haze parameter is small generally improves uniformity of a polishing effect as an entire surface of the object to be polished by adsorption of an additive component on an abrasive and/or adsorption of the additive component on the object to be polished and reduces the haze. Thus, by setting the polishing time of the polishing step using the polishing composition in which the value of the haze parameter is small to a certain period of time or shorter, the haze reduction effect can be obtained while maintaining a low number of defects.

The value of the haze parameter is obtained in the standard test 1. The above mechanism is based on speculation, and this mechanism being correct or incorrect does not affect the technical scope of the present invention.

An embodiment of the present invention relates to a method of polishing an object to be polished containing a material having a silicon-silicon bond, the polishing method including a final polishing step $P_f$, in which the final polishing step $P_f$ has a plurality of polishing sub-steps, the plurality of polishing sub-steps are continuously performed on the same polishing platen, a final polishing sub-step in the plurality of polishing sub-steps is a polishing sub-step $P_{ff}$ of polishing using a polishing composition $S_{ff}$, the polishing sub-step provided before the polishing sub-step $P_{ff}$ in the plurality of polishing sub-steps is a polishing sub-step $P_{fp}$ of polishing using the polishing composition $S_{fp}$, and the polishing composition $S_{ff}$ contains an abrasive $A_{ff}$, a basic compound $B_{ff}$, and hydroxyethyl cellulose (that is, the above condition (B) is satisfied). According to one embodiment of the present invention, there is provided means capable of achieving both a reduction in the number of defects and a reduction in haze in an object to be polished after polishing at a high level in a method of polishing the object to be polished containing a material having a silicon-silicon bond.

The present inventors speculate the mechanism by which the above-mentioned problems can be solved by the embodiment as follows.

Hydroxyethyl cellulose functions as a wetting agent in the polishing composition and alleviates a chemical action caused by etching of the polishing composition and a mechanical action caused by collision of an abrasive, so that the uniformity of the polishing effect as the entire surface of an polished object to be polished is improved, contributing the reduction in haze. However, although hydroxyethyl cellulose can improve the uniformity as the entire surface of the object to be polished and reduce the haze, it may not be possible to reduce the number of defects, which is a local deterioration in surface quality.

On the other hand, in one embodiment of the present invention, the final polishing step $P_f$ has a plurality of polishing sub-steps, and the plurality of polishing sub-steps are continuously performed on the same polishing platen. Then, in the final polishing sub-step $P_{ff}$ in the plurality of polishing sub-steps, the object to be polished is polished using the polishing composition $S_{ff}$ containing the abrasive $A_{ff}$, the basic compound $B_{ff}$, and hydroxyethyl cellulose. Thus, the haze reduction effect can be obtained while achieving a low number of defects by the polishing step before the final polishing step $P_f$ or the polishing sub-step $P_{fp}$ before the final polishing sub-step $P_{ff}$ in the plurality of polishing sub-steps.

The above mechanism is based on speculation, and this mechanism being correct or incorrect does not affect the technical scope of the present invention.

The polishing method according to one embodiment of the present invention preferably satisfies both the above condition (A) and the above condition (B).

The polishing method according to one embodiment of the present invention includes a plurality of polishing steps. Here, the number of polishing steps is not particularly limited, and can be appropriately set according to the type of the object to be polished, a target surface quality, a polishing apparatus to be used, polishing conditions, and the like.

(Object to be Polished)

The object to be polished using the polishing composition according to one embodiment of the present invention is an object to be polished containing a material having a silicon-silicon bond (also simply referred to as "object to be polished" in the present specification).

An aspect of the object to be polished containing the material having a silicon-silicon bond is not particularly limited, a layer which is a flat plate-like member is preferable, a substrate containing the layer is more preferable, and a semiconductor substrate is further preferable. For example, a substrate composed of a single layer, a substrate including a layer to be polished and another layer (for example, a support layer or another functional layer), and the like can be mentioned.

The material having a silicon-silicon bond is not particularly limited, and examples thereof include polysilicon, amorphous silicon, single crystal silicon, n-type doped single crystal silicon, p-type doped single crystal silicon, Si-based alloys such as SiGe, and the like. Among these materials, from the viewpoint that the effect of the present invention can be obtained more remarkably, polysilicon, amorphous silicon, single crystal silicon, n-type doped single crystal silicon or p-type doped single crystal silicon is preferable, polysilicon, single crystal silicon, n-type doped single crystal silicon or p-type doped single crystal silicon is more preferable, and single crystal silicon, n-type doped single crystal silicon, or p-type doped single crystal silicon is further preferable. These materials having a silicon-silicon bond may be used either individually or in combination of two or more.

When the object to be polished containing a silicon material contains a material other than silicon, the material is not particularly limited, and examples thereof include one or more selected from metals or metalloids such as aluminum, nickel, tungsten, steel, tantalum, titanium, stainless steel, and the like, or alloys thereof; glassy materials such as quartz glass, aluminosilicate glass, glassy carbon, and the like; ceramic materials such as alumina, silica, sapphire, silicon nitride, tantalum nitride, titanium carbide, and the like; compound semiconductor substrate materials such as silicon carbide, gallium nitride, gallium arsenide, and the like; resin materials such as polyimide resins and the like; and the like.

Among these materials, the object to be polished containing the material having a silicon-silicon bond is preferably the object to be polished composed of only the material having a silicon-silicon bond. Thus, a silicon substrate (silicon wafer) is mentioned as a preferable object to be polished, and a particularly preferable object to be polished is a single-crystalline silicon substrate (single crystal silicon wafer).

(Final Polishing Step $P_f$)

The polishing method according to one embodiment of the present invention includes the final polishing step $P_f$. Here, the final polishing step $P_f$ has a plurality of polishing sub-steps, and the plurality of polishing sub-steps are continuously performed on the same polishing platen. The final polishing sub-step in the plurality of polishing sub-steps is the polishing sub-step $P_{ff}$ of polishing using the polishing composition $S_{ff}$, and the polishing sub-step provided before the polishing sub-step $P_{ff}$ in the plurality of polishing sub-steps is the polishing sub-step $P_{fp}$ of polishing using the polishing composition $S_{fp}$. The polishing composition $S_{ff}$ satisfies at least one of the following condition (A) or the following condition (B):

condition (A): the value of the haze parameter of the polishing composition $S_{ff}$ obtained in the standard test 1 is smaller than the value of the haze parameter of the polishing composition $S_{fp}$ obtained in the standard test 1, and condition (B): the polishing composition $S_{ff}$ contains the abrasive $A_{ff}$, the basic compound $B_{ff}$, and hydroxyethyl cellulose.

The final polishing step $P_f$ is preferably a step of polishing using the polishing composition $S_{fp}$ and the polishing composition $S_{ff}$ in which a polishing removal rate obtained in a standard test 2 described later is more than 0 nm/min and less than 50 nm/min. However, the final polishing step $P_f$ is not limited to this.

Here, the standard test 2 means a test consisting of a pretreatment in which after a weight of the object to be polished containing the material having a silicon-silicon bond is measured before polishing, the object to be polished is immersed in a 2% by weight aqueous hydrogen fluoride solution for 30 seconds and rinsed with deionized water, a standard polishing step is performed in which the object to be polished after the pretreatment is subjected to single side polishing, using a polishing composition in which the polishing removal rate is determined, using a suede type polishing pad, under conditions in which a polishing load is 15 kPa, a platen rotation speed and a head rotation speed are 30 rpm, a supply flow rate of the polishing composition in which the polishing removal rate is determined is 0.4 L/min, a polishing time is 600 seconds, a temperature of platen cooling water is 20° C., a holding temperature of the polishing composition in which the polishing removal rate is determined is 20° C., and the polishing composition in which the polishing removal rate is determined is continuously supplied, a cleaning process in which the object to be polished after the polishing processing by the standard polishing step is immersed and cleaned for 6 minutes in a cleaning solution of 40° C. or more and 80° C. or less prepared by mixing in a volume ratio of 29% by weight concentration of ammonia water:31% by weight concentration of hydrogen peroxide solution:deionized water=1:1:12, and the object to be polished is immersed in the deionized water in a state where an ultrasonic oscillator is operated, and then dried, and a measurement in which for the object to be polished after the cleaning processing, the weight after polishing is measured, and a calculation in which the polishing removal rate is calculated from a weight difference before and after polishing of the object to be polished, an area of a polished surface of the object to be polished, and a specific gravity of the object to be polished. Details of the polishing removal rate obtained in the standard test 2 will be described later.

[Polishing Sub-Step $P_{fp}$ Provided Before Polishing Sub-Step $P_{ff}$]

The polishing method according to one embodiment of the present invention has the final polishing step $P_f$, the final polishing step $P_f$ has a plurality of polishing sub-steps, and the polishing sub-step $P_{fp}$ provided before the final polishing sub-step $P_{ff}$ in the plurality of polishing sub-steps is the polishing sub-step of polishing using the polishing composition $S_{fp}$. The polishing sub-step $P_{fp}$ acts to reduce the number of defects on the surface of the object to be polished.

The polishing sub-step $P_{fp}$ may have (include) only one polishing sub-step or may have a plurality of continuous polishing sub-steps (may include a set of the plurality of continuous polishing sub-steps). The number of polishing sub-steps $P_{fp}$ is not particularly limited, and from the viewpoint of production efficiency, the number of polishing sub-steps $P_{fp}$ is preferably 1 or more and 5 or less, more preferably 1 or more and 3 or less, further preferably 1 or 2, and particularly preferable 1.

In the polishing sub-step $P_{fp}$, the polishing composition $S_{fp}$ is not particularly limited, and when the polishing sub-step $P_{fp}$ includes only one polishing sub-step, the polishing composition $S_{fp}$ preferably contains an abrasive $A_{fp}$. The polishing composition $S_{fp}$ is not particularly limited, and preferably contains a basic compound $B_{fp}$. Thus, a preferable example of the polishing composition $S_{fp}$ includes a polishing composition containing the abrasive $A_{fp}$ and the basic compound $B_{fp}$. The polishing composition $S_{fp}$ is not particularly limited, and preferably contains substantially no hydroxyethyl cellulose (HEC). Thus, a preferable example of the polishing composition $S_{fp}$ includes a polishing composition containing the abrasive $A_{fp}$ and the basic compound $B_{fp}$ and containing substantially no hydroxyethyl cellulose (HEC).

When the polishing sub-step $P_{fp}$ includes a plurality of polishing sub-steps (includes a set of the plurality of polishing sub-steps), the polishing composition $S_{fp}$ used in at least one polishing sub-step is preferably any of the above-mentioned preferable polishing compositions and more preferably a polishing composition containing the abrasive $A_{fp}$ and the basic compound $B_{fp}$ and containing substantially no hydroxyethyl cellulose (HEC). In this case, the polishing composition $S_{fp}$ used in all the polishing sub-steps is preferably any of the above-mentioned preferable polishing compositions and more preferably a polishing composition containing the abrasive $A_{fp}$ and the basic compound $B_{fp}$ and containing substantially no hydroxyethyl cellulose (HEC). By using the polishing composition $S_{fp}$ as described above, the number of defects on the surface of the object to be polished can be further reduced. The details of the abrasive $A_{fp}$ and the basic compound $B_{fp}$ will be described later.

In the present specification, "containing substantially no hydroxyethyl cellulose" means a case where a content of hydroxyethyl cellulose is 0.00001% by weight or less with respect to a total weight of the polishing composition.

In the polishing composition $S_{fp}$ used in the polishing sub-step $P_{fp}$, $R1_{fp}/R2_{fp}$ is preferably 1.25 or less. Here, $R1_{fp}$ is D90 (nm) of particles present in the polishing composition $S_{fp}$, and $R2_{fp}$ is D90 (nm) of the particles present in the polishing composition after pH of the polishing composition $S_{fp}$ is adjusted to 12.5 using potassium hydroxide and stirring is performed for 30 minutes. D90 (nm) indicates a particle diameter when a cumulative particle diameter distribution from a small particle diameter side reaches 90% in a volume-based particle size distribution (volume-based particle diameter distribution) obtained by a dynamic light scattering method. That is, when D90 of the particles present in the polishing composition $S_{fp}$, which is measured by the dynamic light scattering method, is $R1_{fp}$, and D90 of the particles present in the polishing composition $S_{fp}$ after adjusting the pH to 12.5 using potassium hydroxide and stirring for 30 minutes, which is measured by the dynamic light scattering method, is $R2_{fp}$, $R1_{fp}/R2_{fp}$ is preferably 1.25 or less.

For example, when the polishing composition $S_{fp}$ contains an abrasive, the particles present in the polishing composition $S_{fp}$ are mainly the abrasive. Thus, in this case, $R1_{fp}$ represents D90 of the abrasive in a presence state in the polishing composition $S_{fp}$. By adjusting the pH of the polishing composition to 12.5 using potassium hydroxide, components adsorbed on the abrasive in a state of the polishing composition can be separated from the abrasive. Thus, $R2_{fp}$ represents D90 of the abrasive in a state in which an influence of components other than the abrasive in the polishing composition $S_{fp}$ is small, that is, in a state close to a dispersed state of the abrasive themselves in a dispersing medium. Thus, $R1_{fp}/R2_{fp}$ represents a rate of change of the particle size of the state of the polishing composition $S_{fp}$ with respect to the particle size of a state in which only the abrasive are dispersed in the dispersing medium.

When the particle size change rate $R1_{fp}/R2_{fp}$ is 1.25 or less, the number of defects can be further reduced. Although the detailed reason for this is unknown, it is presumed that this is because the adsorption of the components other than the abrasive in the polishing composition $S_{fp}$ on the abrasive is suppressed, non-uniformity of collision energy of each abrasive on the object to be polished is suppressed, and occurrence of local scratches on the surface of the object to be polished is suppressed. From the same viewpoint, the particle size change rate $R1_{fp}/R2_{fp}$ is more preferably 1.23 or less, and further preferably 1.2 or less. The lower limit of the particle size change rate $R1_{fp}/R2_{fp}$ is not particularly limited, and is usually preferably 1 or more. This is because it is considered that this range indicates that deterioration due to decomposition of an abrasive and the like do not occur in the polishing composition $S_{fp}$.

When the polishing sub-step $P_{fp}$ includes a plurality of polishing sub-steps (includes a set of the plurality of polishing sub-steps), in the polishing composition $S_{fp}$ used in at least one polishing sub-step, it is preferable that the particle size change rate $R1_{fp}/R2_{fp}$ satisfies the above range. In this case, in the polishing composition $S_{fp}$ used in all the polishing sub-steps, it is more preferable that the particle size change rate $R1_{fp}/R2_{fp}$ satisfies the above range. By using the polishing composition $S_{fp}$ as described above, the number of defects on the surface of the object to be polished can be further reduced.

However, the polishing composition $S_{fp}$ is not limited to those having these particle size change rate values.

$R1_{fp}$ and $R2_{fp}$ can be measured by a dynamic light scattering method using "Nanotrack (registered trademark) UPA-UT151" manufactured by Nikkiso Co., Ltd. Details of the method of measuring $R1_{fp}$ and $R2_{fp}$ will be described in Examples.

$R1_{fp}$ can be controlled mainly by the type and added amount of an abrasive, the type and added amount of the components other than the abrasive in the polishing composition, combinations thereof, etc., and $R2_{fp}$ can be controlled mainly by the type and added amount of an abrasive, etc.

Regarding $R1_{fp}/R2_{fp}$, for example, when the polishing composition $S_{fp}$ contains hydroxyethyl cellulose and the content of this is reduced, or when the polishing composition $S_{fp}$ contains substantially no hydroxyethyl cellulose, $R1_{fp}/R2_{fp}$ becomes small.

A preferable example of the polishing composition $S_{fp}$ includes a polishing composition which contains the abrasive $A_{fp}$ and the basic compound $B_{fp}$ and in which $R1_{fp}/R2_{fp}$ is 1.25 or less.

The polishing time of the polishing sub-step $P_{fp}$ (all the polishing sub-steps when a plurality of polishing sub-steps are provided (a set of the plurality of polishing sub-steps is included)) is not particularly limited as long as it is more than 0 seconds, and is preferably 20 seconds or more, more preferably 80 seconds or more, and further preferably 140 seconds or more. Within the above range, the effect of reducing the number of defects is further improved. The polishing time is not particularly limited, and is preferably 450 seconds or less, more preferably 350 seconds or less, and further preferably 300 seconds or less. Within the above range, the production efficiency is further improved. Thus, a preferable example of the polishing time of the polishing sub-step $P_{fp}$ is 20 seconds or more and 450 seconds or less.

[Polishing sub-step $P_{ff}$ as final polishing sub-step]

The polishing method according to one embodiment of the present invention has the final polishing step $P_f$, the final polishing step $P_f$ has a plurality of polishing sub-steps, and the final polishing sub-step in the plurality of polishing sub-steps is the polishing sub-step $P_{ff}$ of polishing using the polishing composition $S_{ff}$. The final polishing sub-step $P_{ff}$ does not increase the number of defects on the surface of the object to be polished, and acts to reduce the haze.

The polishing sub-step $P_{ff}$ is composed of only one polishing sub-step.

The above condition (A) is a condition in which the value of the haze parameter of the polishing composition $S_{ff}$ used in the polishing sub-step $P_{ff}$ is smaller than the value of the haze parameter of the polishing composition $S_{fp}$. In the condition (A), the value of the haze parameter of the polishing composition $S_{ff}$ is not particularly limited as long as it is smaller than the value of the haze parameter of the polishing composition $S_{fp}$, and the smaller the value, the more preferable. Here, the value of the haze parameter of the polishing composition $S_{ff}$ is preferably 99 or less, and more preferably 95 or less (lower limit 0).

In the condition (A), when the polishing sub-step $P_{fp}$ includes a plurality of polishing sub-steps, the value of the haze parameter of the polishing composition $S_{ff}$ is smaller than the value of the haze parameter of the polishing composition $S_{fp}$ used in all the polishing sub-steps. As described above, the value of the haze parameter is obtained in the standard test 1 shown below.

[Standard Test 1]

The standard test 1 for determining the haze parameter of the polishing composition is, more specifically, a test in which the following 1-1. to 1-4. are sequentially performed.

1-1. Polishing Processing by Pre-Polishing Step

A test piece made of the same material as the object to be polished is prepared. Here, the test piece is not particularly limited, and examples thereof include a circular wafer, a chip cut into a quadrangle, and the like. Then, the prepared test piece is subjected to single side polishing, using the polishing composition C prepared by mixing in deionized water (DIW) so that a content (concentration) of colloidal silica having an average primary particle diameter of 35 nm by a BET method is 0.95% by weight and a content (concentration) of potassium hydroxide (KOH) is 0.065% by weight, using a pad (for example, thickness 1.27 mm, hardness 60 (Asker C), compression rate 9.4%) in which a non-woven fabric substrate is impregnated with a polyurethane resin (as such a commercially available product, for example, "SUBA400" manufactured by Nitta Haas Incorporated can be used) as a polishing pad, under conditions in which the polishing load is 19 kPa, the platen (polishing platen) rotation speed is 32 rpm, the head (carrier) rotation speed is 30 rpm, the supply flow rate of the polishing composition C is 1.0 L/min, the polishing time is 160 seconds, the temperature of platen cooling water is 20° C., and the holding temperature of the polishing composition C is 20° C. Here, a polishing machine is not particularly limited as long as it can perform single side polishing, and a single-wafer polishing machine "PNX-332B" manufactured by Okamoto Machine Tool Works, Ltd. can be used. As a method of supplying the polishing composition C, a supply method (one-way) in which the polishing composition C is continuously supplied by a pump or the like is applied.

1-2. Polishing Processing by Post-Polishing Step

The object to be polished after the polishing processing by the pre-polishing step is subjected to single side polishing, using the polishing composition (for example, the polishing composition $S_{fp}$ and the polishing composition $S_{ff}$) in which the haze parameter is confirmed respectively, on a polishing platen different from the polishing platen in the pre-polishing step, using a suede type polishing pad (for example, thickness about 1.5 mm, density about 0.4 g/cm$^3$, compression rate about 20%, compressive elastic modulus about 90%, hardness about 40° (Shore A (Durometer A type)), average opening diameter about 45 μm, opening rate about 25%) (as such a commercially available product, for example, "POLYPAS (registered trademark) 27NX" manufactured by Fujibo Ehime Co., Ltd. can be used) as a polishing pad, under conditions in which the polishing load is 16 kPa, the platen (polishing platen) rotation speed and the head (carrier) rotation speed are 30 rpm, the supply flow rate of the polishing composition is 2.0 L/min, the polishing time is 160 seconds, the temperature of platen cooling water is 20° C., and the holding temperature of the polishing composition is 20° C. Here, a polishing machine is not particularly limited as long as it can perform single side polishing, and a single-wafer polishing machine "PNX-332B" manufactured by Okamoto Machine Tool Works, Ltd. can be used. As a method of supplying the polishing composition, a supply method (one-way) in which the polishing composition is continuously supplied by a pump or the like is applied.

1-3. Cleaning Processing

In the state in which the ultrasonic oscillator is operated, the test piece after the polishing processing by the above post-polishing step is cleaned by being immersed for 6 minutes in a cleaning solution prepared by mixing in a volume ratio of 29% by weight concentration ammonia water:31% by weight concentration hydrogen peroxide solution:deionized water (DIW)=2:5.4:20. The cleaning solution shall be in the range of 40° C. or more and 80° C. or less. Then, the test piece is immersed in deionized water (DIW) in the state in which the ultrasonic oscillator is operated, and then dried.

1-4. Calculation of Haze Parameter

The haze (%) of the test piece after the cleaning processing is measured by a DWO mode using "Surfscan SP2$^{XP}$" manufactured by KLA-Tencor Corporation. The haze parameter is evaluated with a relative value with the haze (%) of the silicon wafer after polishing by the polishing composition $S_{fp}$ as 100. When there are a plurality of the polishing compositions $S_{fp}$, the haze (%) of the polishing composition $S_{fp}$ having the best haze is set to 100.

The haze parameters can be controlled by the compositions of the polishing composition $S_{ff}$ and the polishing composition $S_{fp}$. For example, when the polishing composition $S_{ff}$ contains hydroxyethyl cellulose or when the content increases, the haze parameter tends to decrease. When the polishing composition $S_{fp}$ contains hydroxyethyl cellulose and the content of hydroxyethyl cellulose is reduced, or when hydroxyethyl cellulose is substantially not contained, the haze parameter tends to decrease.

In the condition (A), the polishing composition $S_{ff}$ used in the polishing sub-step $P_{ff}$ is not particularly limited as long as it has the value of the haze parameter obtained in the above standard test 1, and preferably contains the abrasive $A_{ff}$. The polishing composition $S_{ff}$ is not particularly limited, and preferably contains the basic compound $B_{ff}$. Thus, a preferable example of the polishing composition $S_{ff}$ includes a polishing composition containing the abrasive $A_{ff}$ and the basic compound $B_{ff}$. The polishing composition $S_{ff}$ is not particularly limited, and preferably contains hydroxyethyl cellulose (HEC). Thus, a preferable example of the polishing composition $S_{ff}$ includes a polishing composition containing the abrasive $A_{ff}$, the basic compound $B_{ff}$, and hydroxyethyl cellulose (HEC). Details of the abrasive $A_{ff}$, the basic compound $B_{ff}$, and hydroxyethyl cellulose will be described later.

The above condition (B) is a condition in which the polishing composition $S_{ff}$ used in the polishing sub-step $P_{ff}$ contains the abrasive $A_{ff}$, the basic compound $B_{ff}$, and hydroxyethyl cellulose (HEC). Details of the abrasive $A_{ff}$, the basic compound $B_{ff}$, and hydroxyethyl cellulose will be described later.

In the polishing composition $S_{ff}$ used in the polishing sub-step $P_{ff}$, $R1_{ff}/R2_{ff}$ is preferably more than 1.25. Here, $R1_{ff}$ is D90 (nm) of particles present in the polishing composition $S_{ff}$, and $R2_{ff}$ is D90 (nm) of the particles present in the polishing composition after pH of the polishing composition $S_{ff}$ is adjusted to 12.5 using potassium hydroxide and stirring is performed for 30 minutes. D90 (nm) indicates the particle diameter when the cumulative particle diameter distribution from the small particle diameter side reaches 90% in the volume-based particle size distribution obtained by the dynamic light scattering method. That is, when D90 of the particles present in the polishing composition $S_{ff}$, which is measured by the dynamic light scattering method, is $R1_{ff}$, and D90 of the particles present in the polishing composition $S_{ff}$ after adjusting the pH to 12.5 using potassium hydroxide and stirring for 30 minutes, which is measured by the dynamic light scattering method, is $R2_{ff}$, $R1_{ff}/R2_{ff}$ is preferably more than 1.25.

For example, when the polishing composition $S_{ff}$ contains an abrasive, the particles present in the polishing composition $S_{ff}$ are mainly the abrasive. Thus, in this case, $R1_{ff}$ represents D90 of the abrasive in a presence state in the polishing composition $S_{ff}$. By adjusting the pH of the polishing composition to 12.5 using potassium hydroxide, components adsorbed on the abrasive in a state of the polishing composition can be separated from the abrasive. Thus, $R2_{ff}$ represents D90 of the abrasive in the state in which then influence of components other than the abrasive in the polishing composition $S_{ff}$ is small, that is, in the state close to the dispersed state of the abrasive themselves in the dispersing medium. Thus, $R1_{ff}/R2_{ff}$ represents the rate of change of the particle size of the state of the polishing composition $S_{ff}$ with respect to the particle size of a state in which only the abrasive are dispersed in the dispersing medium.

When the particle size change rate $R1_{ff}/R2_{ff}$ is more than 1.25, a haze reduction effect in the polishing sub-step $P_{ff}$ is further improved. It is presumed that the reason for this is that, although the details are unknown, uniformity of a polishing effect as the entire surface of the object to be polished is improved by adsorption of an additive component on an abrasive and/or adsorption of the additive component on the object to be polished. The particle size change rate $R1_{ff}/R2_{ff}$ is not particularly limited, and is preferably 1.5 or less.

The measurement method and control method of $R1_{ff}$ and $R2_{ff}$ are the same as those described in $R1_{fp}$ and $R2_{fp}$ above. Details of the method of measuring $R1_{ff}$ and $R2_{ff}$ will be described in Examples.

However, the polishing composition $S_{ff}$ is not limited to those having these particle size change rate values.

A preferable example of the polishing composition $S_{ff}$ includes a polishing composition which contains the abrasive $A_{ff}$ and in which $R1_{ff}/R2_{ff}$ is more than 1.25.

The polishing time of the polishing sub-step $P_{ff}$ is not particularly limited, and is preferably 80 seconds or less, more preferably 60 seconds or less, further preferably 30 seconds or less, still more preferably 20 seconds or less, and particularly preferably 10 seconds or less. Within the above range, an increase in the number of defects can be further suppressed. The polishing time of the polishing sub-step $P_{ff}$ is not particularly limited as long as it is more than 0 seconds, and is preferably 1 second or more, more preferably 3 seconds or more, and further preferably 5 seconds or more. Within the above range, the effect of reducing the haze is further improved. Thus, a preferable example of the polishing time of the polishing sub-step $P_{ff}$ is more than 0 second and 80 seconds or less.

A relationship between the polishing time of the final polishing sub-step $P_{ff}$ and the polishing time of the polishing sub-step $P_{fp}$ is not particularly limited, and when the polishing time of the polishing sub-step $P_{fp}$ (total polishing time if there are a plurality of polishing times) is $T_{fp}$ (seconds) and the polishing time of the polishing sub-step $P_{ff}$ is $T_{ff}$ (seconds), the following formula (1) is preferably satisfied.

$$\{T_{ff}/(T_{fp}+T_{ff})\}\times 100<50(\%) \qquad \text{[Mathematical formula 1]}$$

When a ratio of the polishing time of the polishing sub-step $P_{ff}$ calculated on the left side of the above formula is within the above range, the effect of reducing the number of defects is improved. From the same viewpoint, the upper limit of the ratio of the polishing time of the polishing sub-step $P_{ff}$ is preferably 25% or less, and more preferably 10% or less. The lower limit of the ratio of the polishing sub-step $P_{ff}$ is not particularly limited as long as it is more than 0%, and is preferably 1% or more, and more preferably 5% or more. Within this range, the haze reduction effect is further improved.

(Preliminary Polishing Step $P_p$)

A preferred embodiment of the present invention has a preliminary polishing step $P_p$ prior to the final polishing step $P_f$ described above. In this embodiment, the preliminary polishing step $P_p$ is a step of polishing using the polishing composition $S_p$ in which the polishing removal rate obtained in the standard test 2 is 50 nm/min or more, and the final polishing step $P_f$ is a step of polishing using the polishing composition $S_f$ in which the polishing removal rate obtained in the standard test 2 is more than 0 nm/min and less than 50 nm/min. Here, the polishing composition $S_{ff}$ and the polishing composition $S_{fp}$ both correspond to the polishing composition $S_f$. Details of the standard test 2 will be described later.

The preliminary polishing step $P_p$ and the final polishing step $P_f$ are preferably performed on different polishing platens.

Since the final polishing step $P_f$ having a particularly large effect on the surface quality includes the polishing sub-step $P_{fp}$ mainly aimed at reducing the number of defects and the polishing sub-step $P_{ff}$ mainly aimed at reducing the haze, the preliminary polishing step $P_p$ in which the polishing removal rate is high is provided, so that while achieving a desired polishing performance including high production efficiency, a more excellent effect of reducing the number of defects and higher haze is provided.

In the preliminary polishing step $P_p$, as long as the polishing composition $S_p$ in which the polishing removal rate obtained in the standard test 2 is 50 nm/min or more is used and the polishing sub-steps using the polishing composition are continuously provided, two or more polishing sub-steps may be included. That is, the preliminary polishing step $P_p$ may be composed of only one polishing sub-step or may be composed of a plurality of polishing sub-steps. The number of polishing sub-steps constituting the preliminary polishing step $P_p$ is not particularly limited, and from the viewpoint of production efficiency, the number of polishing sub-steps is preferably 1 or more and 5 or less, more preferably 1 or more and 3 or less, further preferably 1 or 2, and particularly preferably 1.

When the preliminary polishing step $P_p$ is provided, the polishing composition $S_f$ used in the final polishing step $P_f$ is the polishing composition $S_f$ in which the polishing removal rate obtained in the standard test 2 is more than 0 nm/min and less than 50 nm/min. That is, in this case, both the polishing composition $S_{ff}$ used in the final $P_{ff}$ in the plurality of polishing sub-steps of the final polishing step $P_f$ and the polishing composition $S_{fp}$ used in the polishing sub-step $P_{fp}$ provided before the polishing sub-step $P_{ff}$ in the plurality of polishing sub-steps are the polishing compositions $S_f$ in which the polishing removal rate is more than 0 nm/min and less than 50 nm/min.

The arrangement position of the preliminary polishing step $P_p$ (if there are a plurality of preliminary polishing steps, the final preliminary polishing step $P_p$) is not particularly limited, and is preferably provided immediately before the final polishing step $P_f$.

As described above, whether a certain polishing step corresponds to the preliminary polishing step $P_p$, the final polishing step $P_f$, an intermediate polishing step $P_i$ described later, or another polishing step can be determined by the polishing removal rate obtained in the standard test 2 described later and the arrangement position of the polishing step included therein.

In the polishing composition $S_p$ used in the preliminary polishing step $P_p$, the lower limit of the polishing removal rate obtained in the standard test 2 is not particularly limited as long as it is 50 nm/min or more, and is preferably 100 nm/min or more, and more preferably 150 nm/min or more. Within this range, the production efficiency is further improved. In the polishing composition $S_p$ used in the preliminary polishing step $P_p$, the upper limit of the polishing removal rate obtained in the standard test 2 is not particularly limited, and is preferably 1000 nm/min or less, more preferably 500 nm/min or less, and further preferably 300 nm/min or less. Within this range, in the object to be polished after polishing by the final polishing step $P_f$, the number of defects is smaller, and the haze is lower.

In the polishing composition $S_f$ ($S_{fp}$ and $S_{ff}$) used in the final polishing step $P_f$, the lower limit of the polishing removal rate obtained in the standard test 2 is not particularly limited as long as it is more than 0 nm/min, and is preferably 5 nm/min or more, and more preferably 10 nm/min or more. Within this range, the production efficiency is further improved. In the polishing composition $S_f$ ($S_{fp}$ and $S_{ff}$) used in the final polishing step $P_f$, the upper limit of the polishing removal rate obtained in the standard test 2 is not particularly limited as long as it is less than 50 nm/min, and is preferably 30 nm/min or less, and more preferably 20 nm/min or less. Within this range, the effect of reducing the number of defects and the haze is improved.

[Standard Test 2]

The standard test 2 for determining the polishing removal rate of the polishing composition is, more specifically, a test in which the following 2-1. to 2-4. are sequentially performed.

2-1. Pretreatment

A test piece made of the same material as the target object to be polished is prepared, the weight before polishing is measured, and then the test piece is immersed in a 2% by weight HF (hydrogen fluoride) aqueous solution for 30 seconds and rinsed with deionized water to perform pretreatment. Here, the test piece is not particularly limited, and examples thereof include a circular wafer, a chip cut into a quadrangle, and the like.

2-2. Polishing Processing by Standard Polishing Step

The test piece after the pretreatment is subjected to single side polishing, using the polishing composition subjected to the standard test, using a suede type polishing pad (for example, thickness about 1.5 mm, density about 0.4 g/cm$^3$, compression rate about 20%, compressive elastic modulus about 90%, hardness about 40° (Shore A (Durometer A type)), average opening diameter about 45 µm, opening rate about 25%) (as such a commercially available product, for example, "POLYPAS (registered trademark) 27NX" manufactured by Fujibo Ehime Co., Ltd. can be used) as a polishing pad, under conditions in which the polishing load is 15 kPa, the platen (polishing platen) rotation speed and the head (carrier) rotation speed are 30 rpm, the supply flow rate of the polishing composition is 0.4 L/min, the polishing time is 600 seconds, the temperature of platen cooling water is 20° C., and the holding temperature of the polishing composition is 20° C. Here, the polishing machine is not particularly limited as long as it can perform single side polishing, and a single-wafer polishing machine "PNX-322" manufactured by Okamoto Machine Tool Works, Ltd. can be used. As a method of supplying the polishing composition, a supply method (one-way) in which the polishing composition is continuously supplied by a pump or the like is applied.

2-3. Cleaning Processing

The test piece after the polishing processing by the above standard polishing step is cleaned by being immersed for 6 minutes in a cleaning solution prepared by mixing in a volume ratio of 29% by weight concentration ammonia water:31% by weight concentration hydrogen peroxide solution:deionized water (DIW)=1:1:12. The cleaning solution shall be in the range of 40° C. or more and 80° C. or less. Then, the test piece is immersed in deionized water (DIW) in the state in which the ultrasonic oscillator is operated, and then dried by a known drying means, for example, a spin dryer or the like.

2-4. Calculation of Polishing Removal Rate

As to the test piece after the cleaning processing, the weight after polishing is measured, and the polishing removal rate (nm/min) is calculated from the weight difference before and after polishing of the test piece, the area of the polished surface of the test piece, and the specific gravity of the material of the test piece (material of the polished surface of the test piece).

The polishing composition $S_p$ is not particularly limited as long as it has the polishing removal rate obtained in the above standard test 2, and the polishing composition $S_p$ preferably contains an abrasive $A_p$. The polishing composition $S_p$ is not particularly limited, and preferably contains a basic compound $B_p$. Thus, a preferable example of the polishing composition $S_p$ includes a polishing composition containing the abrasive $A_p$ and the basic compound $B_p$. The polishing composition $S_p$ is more preferably a polishing composition containing substantially no HEC. Thus, a preferable example of the polishing composition $S_p$ includes a polishing composition containing the abrasive $A_p$ and the basic compound $B_p$ and containing substantially no HEC.

When the preliminary polishing step $P_p$ includes a plurality of polishing sub-steps (includes a set of the plurality of polishing sub-steps), the polishing composition $S_p$ used in at least one polishing sub-step is preferably any of the above-mentioned preferable polishing compositions and more preferably a polishing composition containing the abrasive $A_p$ and the basic compound $B_p$ and containing substantially no hydroxyethyl cellulose (HEC). In this case, the polishing composition $S_p$ used in all the polishing sub-steps is preferably any of the above-mentioned preferable polishing compositions and more preferably a polishing composition containing the abrasive $A_p$ and the basic compound $B_p$ and containing substantially no hydroxyethyl cellulose (HEC). By using the polishing composition $S_p$ as described above, the number of defects on the surface of the object to be polished can be further reduced. The details of the abrasive $A_p$ and the basic compound $B_p$ will be described later.

In the polishing composition $S_p$ used in the preliminary polishing step $P_p$, the particle size change rate $R1_p/R2_p$ is preferably 1.25 or less. Here, $R1_p$ is D90 (nm) of particles present in the polishing composition $S_p$, and $R2_p$ is D90 (nm) of the particles present in the polishing composition after pH of the polishing composition $S_p$ is adjusted to 12.5 using potassium hydroxide and stirring is performed for 30 minutes. D90 (nm) indicates the particle diameter when the cumulative particle diameter distribution from the small particle diameter side reaches 90% in the volume-based particle size distribution obtained by the dynamic light scattering method. That is, when D90 of the particles present in the polishing composition $S_p$, which is measured by the dynamic light scattering method, is $R1_p$, and D90 of the particles present in the polishing composition $S_p$ after adjusting the pH to 12.5 using potassium hydroxide and stirring for 30 minutes, which is measured by the dynamic light scattering method, is $R2_p$, $R1_p/R2_p$ is preferably 1.25 or less. The particle size change rate $R1_p/R2_p$ is more preferably 1.23 or less, and further preferably 1.2 or less. The lower limit of the particle size change rate $R1_p/R2_p$ is not particularly limited, and is usually preferably 1 or more.

When the preliminary polishing step $P_p$ includes a plurality of polishing sub-steps (includes a set of the plurality of polishing sub-steps), in the polishing composition $S_p$ used in at least one polishing sub-step, it is preferable that the particle size change rate $R1_p/R2_p$ satisfies the above range. In this case, in the polishing composition $S_p$ used in all the polishing sub-steps, it is more preferable that the particle size change rate $R1_p/R2_p$ satisfies the above range. The reason why these ranges and aspects are preferable is the same as that described in the particle size change rate $R1_{fp}/R2_{fp}$. Here, the measurement method and control method of $R1_p$ and $R2_p$ are the same as those described in $R1_{fp}$ and $R2_{fp}$ above. Details of the method of measuring $R1_p$ and $R2_p$ will be described in Examples.

However, the polishing composition $S_p$ is not limited to those having these particle size change rate values.

A preferable example of the polishing composition $S_p$ includes a polishing composition which contains the abrasive $A_p$ and the basic compound $B_p$ and in which $R1_p/R2_p$ is 1.25 or less.

The polishing time of the preliminary polishing step $P_p$ (all the polishing sub-steps when a plurality of polishing sub-steps are provided (a set of the plurality of polishing sub-steps is included)) is not particularly limited, and is preferably more than 0 second, more preferably 20 seconds or more, further preferably 80 seconds or more, and particularly preferably 140 seconds or more. Within the above range, the effect of reducing the number of defects is further improved. The polishing time is not particularly limited, and is preferably 450 seconds or less, more preferably 350 seconds or less, and further preferably 300 seconds or less. Within the above range, the production efficiency is further improved.

(Intermediate Polishing Step $P_i$)

A more preferred embodiment of the present invention has the intermediate polishing step $P_i$ between the final polishing step $P_f$ and the preliminary polishing step $P_p$. Here, the intermediate polishing step $P_i$ is a step performed on the polishing platen different from the polishing platen in the final polishing step $P_f$, and is a step of polishing using the polishing composition $S_i$ in which the polishing removal rate obtained in the standard test 2 is more than 0 nm/min and less than 50 nm/min.

The intermediate polishing step $P_i$ and the preliminary polishing step $P_p$ are preferably performed on different polishing platens.

Since the final polishing step $P_f$ having a particularly large effect on the surface quality includes the polishing sub-step $P_{fp}$ mainly aimed at reducing the number of defects and the polishing sub-step $P_{ff}$ mainly aimed at reducing the haze, the intermediate polishing step $P_i$ is provided in addition to the preliminary polishing step $P_p$ in which the polishing removal rate is high, so that while achieving a desired polishing performance including high production efficiency, a more excellent effect of reducing the number of defects and higher haze is provided.

In the intermediate polishing step $P_i$, as long as the polishing composition $S_i$ in which the polishing removal rate obtained in the standard test 2 described above is more than 0 nm/min and less than 50 nm/min is used and the polishing sub-steps using the polishing composition are continuously provided, two or more polishing sub-steps may be included. That is, the intermediate polishing step $P_i$ may be composed of only one polishing sub-step or may be composed of a plurality of polishing sub-steps. The number of polishing sub-steps constituting the intermediate polishing step $P_i$ is not particularly limited, and from the viewpoint of production efficiency, the number of polishing sub-steps is preferably 1 or more and 5 or less, more preferably 1 or more and 3 or less, further preferably 1 or 2, and particularly preferably 1.

In the polishing composition $S_i$ used in the intermediate polishing step $P_i$, the lower limit of the polishing removal rate obtained in the standard test 2 is not particularly limited as long as it is more than 0 nm/min, and is preferably 5 nm/min or more, and more preferably 10 nm/min or more. Furthermore, in the polishing composition $S_i$ used in the intermediate polishing step $P_i$, the upper limit of the polishing removal rate obtained in the standard test 2 is not particularly limited as long as it is less than 50 nm/min, and is preferably 30 nm/min or less, and more preferably 20 nm/min or less. Within this range, the effect of reducing the number of defects and the haze is improved.

The standard test 2 for determining the polishing removal rate of the polishing composition $S_i$ is the same as that described in the above description of the preliminary polishing step $P_p$.

The polishing composition $S_i$ used in the intermediate polishing step $P_i$ is not particularly limited as long as it can achieve the polishing removal rate obtained in the above standard test 2, and preferably contains an abrasive $A_i$. The polishing composition $S_i$ is not particularly limited, and preferably contains a basic compound $B_i$. Thus, a preferable example of the polishing composition $S_i$ includes a polishing composition containing the abrasive $A_i$ and the basic compound $B_i$. The polishing composition $S_i$ is not particularly limited, and preferably contains substantially no hydroxyethyl cellulose (HEC). Thus, a preferable example of the polishing composition $S_i$ includes a polishing composition containing the abrasive $A_i$ and the basic compound $B_i$ and containing substantially no hydroxyethyl cellulose (HEC). When the intermediate polishing step $P_i$ includes a plurality of polishing sub-steps, the polishing composition $S_i$ used in at least one polishing sub-step is preferably any of the above-mentioned preferable polishing compositions and more preferably a polishing composition containing the abrasive $A_i$ and the basic compound $B_i$ and containing substantially no hydroxyethyl cellulose (HEC). In this case, the polishing composition $S_i$ used in all the polishing sub-steps is preferably any of the above-mentioned preferable polishing compositions and more preferably a polishing composition containing the abrasive $A_i$ and the basic compound $B_i$ and containing substantially no hydroxyethyl cellulose (HEC). By using the polishing composition $S_i$ as described above, the number of defects on the surface of the object to be polished can be further reduced. The details of the abrasive $A_i$ and the basic compound $B_i$ will be described later.

In the polishing composition $S_i$ used in the intermediate polishing step $P_i$, the particle size change rate $R1_i/R2_i$ is preferably 1.25 or less. Here, $R1_i$ is D90 (nm) of particles present in the polishing composition $S_i$, and $R2_i$ is D90 (nm) of the particles present in the polishing composition after pH of the polishing composition $S_i$ is adjusted to 12.5 using potassium hydroxide and stirring is performed for 30 minutes. D90 (nm) indicates the particle diameter when the cumulative particle diameter distribution from the small particle diameter side reaches 90% in the volume-based particle size distribution obtained by the dynamic light scattering method. That is, when D90 of the particles present in the polishing composition $S_i$, which is measured by the dynamic light scattering method, is $R1_i$, and D90 of the particles present in the polishing composition $S_i$ after adjusting the pH to 12.5 using potassium hydroxide and stirring for 30 minutes, which is measured by the dynamic light scattering method, is $R2_i$, $R1_i/R2_i$ is preferably 1.25 or less. The particle size change rate $R1_i/R2_i$ is more preferably 1.23 or less, and further preferably 1.2 or less. The lower limit of the particle size change rate $R1_i/R2_i$ is not particularly limited, and is usually preferably 1 or more.

When the intermediate polishing step $P_i$ includes a plurality of polishing sub-steps (includes a set of the plurality of polishing sub-steps), in the polishing composition $S_i$ used in at least one polishing sub-step, it is preferable that the particle size change rate $R1_i/R2_i$ satisfies the above range. In this case, in the polishing composition $S_i$ used in all the polishing sub-steps, it is more preferable that the particle size change rate $R1_i/R2_i$ satisfies the above range. The reason why these ranges and aspects are preferable is the same as that described in the particle size change rate $R1_{fp}/R2_{fp}$. Here, the measurement method and control method of $R1_i$ and $R2_i$ are the same as those described in $R1_{fp}$ and $R2_{fp}$ above. Details of the method of measuring the $R1_i/R2_i$ are the same as the details of the method of measuring $R1_{fp}/R2_{fp}$ described in Examples.

However, the polishing composition $S_i$ is not limited to those having these particle size change rate values.

Thus, a preferable example of the intermediate polishing step $P_i$ is a step of polishing using the polishing composition $S_i$ containing the abrasive $A_i$ and the basic compound $B_i$ and substantially not containing hydroxyethyl cellulose, and in the polishing composition $S_i$, the particle size change rate $R1_i/R2_i$ is 1.25 or less.

When the intermediate polishing step $P_i$ is provided, the polishing time is not particularly limited. Here, a total polishing time of the intermediate polishing step $P_i$ and the polishing sub-step $P_{fp}$ (all the polishing sub-steps when a plurality of polishing sub-steps are provided (a set of the plurality of polishing sub-steps is included)) provided before the final polishing sub-step $P_{ff}$ in the plurality of polishing sub-steps of the final polishing step $P_f$ described above is preferably 20 seconds or more, preferably 30 seconds or more, and more preferably 60 seconds or more. Within this range, the effect of reducing the number of defects is further improved. The total polishing time is preferably 450 seconds or less, and more preferably 400 seconds or less. Within this range, productivity is further improved. Thus, a preferable example of the total polishing time of the intermediate polishing step $P_i$ and the polishing sub-step $P_{fp}$ (all the polishing sub-steps when a plurality of polishing sub-steps are provided (a set of the plurality of polishing sub-steps is included)) is 20 seconds or more and 450 seconds or less.

(Other Polishing Step)

The polishing method according to one embodiment of the present invention may further include another polishing step that is neither the preliminary polishing step $P_p$, nor the final polishing step $P_f$, nor the intermediate polishing step $P_i$.

(Other Steps)

The polishing method according to one embodiment of the present invention may further include, if necessary, other steps other than the polishing step, which can be adopted by a known polishing method, in addition to each polishing step described above. The other steps are not particularly limited, and examples thereof include a cleaning step, a drying step, and the like.

The apparatus, method, and conditions applied in other steps are not particularly limited, and known ones are appropriately adopted. As an example of the cleaning step, for example, a step of cleaning the polished object to be polished with a mixed solution (for example, 40° C. or more and 80° C. or less) of ammonia and hydrogen peroxide solution or other steps can be used. Examples of a cleaning method include a method of immersing the object to be polished after polishing in the mixed solution. When the object to be polished after polishing is immersed in the mixed solution, ultrasonic waves may be applied by an ultrasonic oscillator. As an example of the drying step, for example, a step of drying the object to be polished after polishing with a spin dryer or the like, or other steps can be used.

(Polishing Composition)

Hereinafter, regarding the polishing compositions used in the polishing method according to one embodiment of the present invention, including the polishing composition $S_{ff}$ used in the polishing sub-step $P_{ff}$, the polishing composition $S_{fp}$ used in the polishing sub-step $P_{fp}$, the polishing composition $S_p$ used in the preliminary polishing step $P_p$, and the polishing composition $S_i$ used in the intermediate polishing step $P_i$, each component constituting these polishing compositions will be described in detail.

The presence or absence of each component, its content, and a pH value described later may be different for each polishing composition used in each polishing step and each polishing sub-step. Furthermore, the presence or absence of each component, its content, and the pH value may be different for each polishing composition used in each polishing sub-step when each polishing step includes a plurality of polishing sub-steps or when each polishing sub-step includes a plurality of polishing sub-steps.

As described above, in the case of the above condition (B), the polishing composition $S_{ff}$ used in the polishing sub-step $P_{ff}$ contains the abrasive $A_{ff}$, the basic compound $B_{ff}$, and hydroxyethyl cellulose (HEC).

[Abrasive]

Each of the polishing compositions that can be used in one embodiment of the present invention, including the polishing composition $S_{ff}$, the polishing composition $S_{fp}$, the polishing composition $S_p$, and the polishing composition $S_i$, preferably contains an abrasive.

In the case of the above condition (B), the polishing composition $S_{ff}$ contains an abrasive. In this case, except for the polishing composition $S_{ff}$, each of the polishing compositions used in one embodiment of the present invention, including the polishing composition $S_{fp}$, the polishing composition $S_p$, and the polishing composition $S_i$, preferably contains the abrasive.

Here, as described above, the abrasive contained in the polishing composition $S_{ff}$, the polishing composition $S_{fp}$, the polishing composition $S_p$, and the polishing composition $S_i$ are referred to as the abrasive $A_{ff}$, abrasive $A_{fp}$, abrasive $A_p$, and abrasive $A_i$, respectively. The abrasive have a function of mechanically polishing the surface of the object to be polished.

The abrasive contained in the polishing composition used in each polishing step and each polishing sub-step in the polishing method according to one embodiment of the present invention can be each independently appropriately selected according to the polishing conditions, the type of the object to be polished, and the like. Examples of the abrasive include inorganic particles, organic particles, and organic/inorganic composite particles. Specific examples of the inorganic particles include oxide particles such as silica particles, alumina particles, cerium oxide particles, chromium oxide particles, titanium dioxide particles, zirconium oxide particles, magnesium oxide particles, manganese dioxide particles, zinc oxide particles, red iron oxide particles, and the like; nitride particles such as silicon nitride particles, boron nitride particles, and the like; carbide particles such as silicon carbide particles, boron carbide particles, and the like; diamond particles; carbonates such as calcium carbonate, barium carbonate, and the like; and the like. Specific examples of organic particles include polymethyl methacrylate (PMMA) particles, poly(meth)acrylic acid particles, polyacrylonitrile particles, and the like. Herein the (meth)acrylic acid comprehensively means acrylic acid and methacrylic acid. The abrasive can be used singly as one species or in a combination of two or more species.

As the abrasive, inorganic particles are preferable, and among them, particles made of oxides of metals or metalloids are preferable. Particularly preferably the abrasive includes silica particles. Examples of the silica particles include colloidal silica, fumed silica, precipitated silica, and the like.

Among the silica particles, colloidal silica or fumed silica is preferable, and colloidal silica is particularly preferable. That is, it is particularly preferable that the abrasive contains colloidal silica.

In the abrasive contained in the polishing composition used in each polishing step and each polishing sub-step in the polishing method according to one embodiment of the present invention, a preferred particle diameter range varies depending on the purpose of polishing in each polishing step.

An average primary particle diameter of the abrasive $A_p$ contained in the polishing composition $S_p$ is not particularly limited, and is preferably 10 nm or more, more preferably 20 nm or more, and further preferably 30 nm or more. Within this range, the surface of the object to be polished can be easily polished mechanically, and the polishing removal rate is improved. Furthermore, the average primary particle diameter of the abrasive $A_p$ is not particularly limited, and is preferably 100 nm or less, more preferably 80 nm or less, and further preferably 60 nm or less. Within this range, the effect of reducing the number of defects and the haze of the object to be polished is improved.

The average primary particle diameters of the abrasive $A_{fp}$, abrasive $A_{ff}$, and abrasive $A_i$ contained in the polishing composition $S_{fp}$, polishing composition $S_{ff}$, and polishing composition $S_i$ are not particularly limited, and are each preferably 5 nm or more, more preferably 10 nm or more, and further preferably 20 nm or more. Within this range, the surface of the object to be polished can be easily polished mechanically, and the polishing removal rate is improved. Furthermore, the average primary particle diameters of the abrasive $A_{fp}$, abrasive $A_{ff}$, and abrasive $A_i$ are not particularly limited, and are each preferably 60 nm or less, more preferably less than 35 nm, and further preferably 30 nm or less. Within this range, the effect of reducing the number of defects and the haze of the object to be polished is improved.

Thus, as a preferable example, the average primary particle diameter of the abrasive $A_{fp}$ (each of the abrasive $A_{fp}$ when the polishing sub-step $P_{fp}$ includes a plurality of polishing sub-steps) is 5 nm or more and less than 35 nm. Here, when the polishing sub-step $P_{fp}$ includes a plurality of polishing sub-steps, it is preferable that the average primary particle diameter of all the abrasive $A_{fp}$ is within the above range. As a preferable example, the average primary particle diameter of the abrasive $A_{ff}$ is 5 nm or more and less than 35 nm. As a more preferable example, the average primary particle diameters of the abrasive $A_{fp}$ (all the abrasive $A_{fp}$ when the polishing sub-step $P_{fp}$ includes a plurality of polishing sub-steps) and the abrasive $A_{ff}$ are 5 nm or more and less than 35 nm.

An average secondary particle diameter of the abrasive $A_p$ contained in the polishing composition $S_p$ is not particularly limited, and is preferably 15 nm or more, more preferably 35 nm or more, and further preferably 55 nm or more. Within this range, the surface of the object to be polished can be easily polished mechanically, and the polishing removal rate is improved. Furthermore, the average secondary particle diameter of the abrasive $A_p$ is not particularly limited, and is preferably 250 nm or less, more preferably 180 nm or less, and further preferably 150 nm or less. Within this range, the effect of reducing the number of defects and the haze of the object to be polished is improved.

The average secondary particle diameters of the abrasive $A_{fp}$, abrasive $A_{ff}$, and abrasive $A_i$ contained in the polishing composition $S_{fp}$, polishing composition $S_{ff}$, and polishing composition $S_i$ are not particularly limited, and are each preferably 10 nm or more, more preferably 15 nm or more, further preferably 25 nm or more, and particularly preferably 35 nm or more. Within this range, the surface of the object to be polished can be easily polished mechanically, and the polishing removal rate is improved. Furthermore, the average secondary particle diameters of the abrasive $A_{fp}$, abrasive $A_{ff}$, and abrasive $A_i$ are not particularly limited, and are each preferably 100 nm or less, more preferably 90 nm or less, and further preferably 80 nm or less. Within this range, the effect of reducing the number of defects and the haze of the object to be polished is improved.

A value of the average primary particle diameter of the abrasive is calculated from, for example, a specific surface area measured by the BET method. The specific surface area of the abrasive can be measured, for example, by using "Flow SorbII 2300" manufactured by Micromeritics Instrument Corporation. In the present specification, the average primary particle diameter is also referred to as an average primary particle diameter by the BET method.

The average secondary particle diameter of the abrasive can be measured by, for example, a dynamic light scattering method and can be measured, for example, by using "Nanotrack (registered trademark) UPA-UT151" manufactured by Nikkiso Co., Ltd.

In the abrasive contained in the polishing composition used in each polishing step and each polishing sub-step in the polishing method according to one embodiment of the present invention, a preferred content range varies depending on the purpose of polishing in each polishing step.

A content of the abrasive $A_p$ contained in the polishing composition $S_p$ is not particularly limited, and is preferably 0.01% by weight or more, more preferably 0.1% by weight or more, and further preferably 0.5% by weight or more with respect to the total weight of the polishing composition. Within this range, the polishing removal rate is improved. The content of the abrasive $A_p$ is not particularly limited, and is preferably 20% by weight or less, more preferably 10% by weight or less, and further preferably 5% by weight or less with respect to the total weight of the polishing composition. Within this range, the effect of reducing the number of defects and the haze of the object to be polished is improved.

The contents of the abrasive $A_{fp}$, abrasive $A_{ff}$, and abrasive $A_i$ contained in the polishing composition $S_{fp}$, polishing composition $S_{ff}$, and polishing composition $S_i$ are not particularly limited, and are each preferably 0.001% by weight or more, more preferably 0.01% by weight or more, and further preferably 0.1% by weight or more with respect to the total weight of the polishing composition. Within this range, the polishing removal rate is improved. The contents of the abrasive $A_{fp}$, abrasive $A_{ff}$, and abrasive $A_i$ are not particularly limited, and are each preferably 5% by weight or less, more preferably 1% by weight or less, and further preferably 0.5% by weight or less with respect to the total weight of the polishing composition. Within this range, the effect of reducing the number of defects and the haze of the object to be polished is improved.

[Basic Compound]

Each of the polishing compositions that can be used in one embodiment of the present invention, including the polishing composition $S_{ff}$, the polishing composition $S_{fp}$, the polishing composition $S_p$, and the polishing composition $S_i$, preferably contains a basic compound.

In the case of the above condition (B), the polishing composition $S_{ff}$ contains a basic compound. In this case, except for the polishing composition $S_{ff}$, each of the polishing compositions used in one embodiment of the present invention, including the polishing composition $S_{fp}$, the polishing composition $S_p$, and the polishing composition $S_i$, preferably contains the basic compound.

Here, as described above, the basic compounds contained in the polishing composition $S_{ff}$, the polishing composition $S_{fp}$, the polishing composition $S_p$, and the polishing composition $S_i$ are referred to as basic compound $B_{ff}$, basic compound $B_{fp}$, basic compound $B_p$, and basic compound $B_i$, respectively. The basic compound has a function of increasing the pH of the polishing composition by being added to the polishing composition. The basic compound has a function of chemically polishing the surface of the object to be polished by etching and has a function of improving dispersion stability of an abrasive. The basic compound can also be used as a pH adjusting agent.

The basic compounds contained in the polishing composition used in each polishing step and each polishing sub-step in the polishing method according to one embodiment of the present invention can be each independently appropriately selected according to the polishing conditions, the type of the object to be polished, and the like.

Specific examples of the basic compound include hydroxides and salts of Group 2 elements or alkali metals, quaternary ammonium compounds, ammonia (ammonium hydroxide) and salts thereof, amines, and the like. In the hydroxides or salts of Group 2 elements or alkali metals, the Group 2 elements are not particularly limited, but alkaline earth metals are preferably used, and examples thereof include calcium and the like. Examples of the alkali metal include potassium, sodium, and the like. Examples of the salts include carbonate, hydrocarbonate, sulfate, acetate, and the like. Examples of the hydroxides or salts of Group 2 elements or alkali metals include calcium hydroxide, potassium hydroxide, potassium carbonate, potassium hydrogen carbonate, potassium sulfate, potassium acetate, potassium chloride, sodium hydroxide, sodium hydrogen carbonate, sodium carbonate, and the like. Examples of the quaternary ammonium compounds include hydroxide, chloride, salts such as carbonate, hydrocarbonate, sulfate, phosphate, and the like of tetramethylammonium, tetraethylammonium, tetrabutylammonium, and the like. Specific examples thereof include tetraalkylammonium hydroxide such as tetramethylammonium hydroxide, tetraethylammonium hydroxide, tetrabutylammonium hydroxide, and the like; tetraalkylammonium carbonate such as tetramethylammonium carbonate, tetraethylammonium carbonate, tetrabutylammonium carbonate, and the like; and tetraalkylammonium chloride such as tetramethylammonium chloride, tetraethylammonium chloride, tetrabutylammonium chloride, and the like; and the like. Examples of other ammonium salts include ammonium carbonate, ammonium hydrogen carbonate, and the like. Specific examples of amines include methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetramine, anhydrous piperazine, piperazine hexahydrate, 1-(2-aminoethyl) piperazine, N-methylpiperazine, guanidine, and the like.

Among these, from the viewpoint of availability and removability, as the basic compound, hydroxide of a Group 2 element or alkali metal, tetraalkylammonium hydroxide, or ammonia (ammonium hydroxide) is preferable, sodium hydroxide, potassium hydroxide, calcium hydroxide, tetramethylammonium hydroxide, or ammonia (ammonium hydroxide) is more preferable, and potassium hydroxide, tetramethylammonium hydroxide, or ammonia (ammonium hydroxide) is further preferable.

The basic compounds can be used singly as one species or in a combination of two or more species.

In the basic compound contained in the polishing composition used in each polishing step and each polishing sub-step in the polishing method according to one embodiment of the present invention, preferred type and content range vary depending on the purpose of polishing in each polishing step.

As a preferred combination of the basic compound $B_p$, the basic compound $B_{ff}$, and the basic compound $B_{fp}$, a preferable embodiment is that the polishing composition $S_p$ used in the preliminary polishing step $P_p$ contains hydroxide of a Group 2 element or alkali metal or tetraalkylammonium hydroxide, and the polishing composition $S_f$ ($S_{fp}$ and $S_{ff}$) used in the final polishing step $P_f$ contains ammonia (ammonium hydroxide). A more preferable embodiment is that the polishing composition $S_p$ used in the preliminary polishing step $P_p$ contains sodium hydroxide, potassium hydroxide, calcium hydroxide or tetramethylammonium hydroxide, and the polishing composition $S_f$ ($S_{fp}$ and $S_{ff}$) used in the final polishing step $P_f$ contains ammonia (ammonium hydroxide). A further preferable embodiment is that the polishing composition $S_p$ used in the preliminary polishing step $P_p$ contains potassium hydroxide, and the polishing composition $S_f$ ($S_{fp}$ and $S_{ff}$) used in the final polishing step Pf contains ammonia (ammonium hydroxide).

A content of the basic compound $B_p$ in the polishing composition $S_p$ is not particularly limited, and is preferably 0.001% by weight or more, more preferably 0.01% by weight or more, and further preferably 0.05% by weight or more with respect to the total weight of the polishing composition. Within this range, the polishing removal rate is improved. The content of the basic compound $B_p$ is not particularly limited, and is preferably 10% by weight or less, more preferably 1% by weight or less, and preferably 0.1% by weight or less with respect to the total weight of the polishing composition. Within this range, the effect of reducing the number of defects and the haze of the object to be polished is improved. Here, when two or more basic compounds are used, the content means a total amount of these basic compounds.

The contents of the basic compound $B_{fp}$, basic compound $B_{ff}$, and basic compound $B_i$ in the polishing composition $S_{fp}$, polishing composition $S_{ff}$, and polishing composition $S_i$ are not particularly limited, and are each preferably 0.0001% by weight or more, more preferably 0.0005% by weight or more, and further preferably 0.001% by weight or more with respect to the total weight of the polishing composition. Within this range, the polishing removal rate is improved. The contents of the basic compound $B_{fp}$, basic compound $B_{ff}$, and basic compound $B_i$ are not particularly limited, and are each more preferably 1% by weight or less, more preferably 0.1% by weight or less, and further preferably 0.05% by weight or less with respect to the total weight of the polishing composition. Within this range, the effect of reducing the number of defects and the haze of the object to be polished is improved. Here, when two or more basic compounds are used, the content means a total amount of these basic compounds.

From the viewpoint of the effect of reducing the number of defects and the haze of the object to be polished, it is preferable that the content of the basic compound in the polishing composition used in each polishing step and each polishing sub-step in the polishing method according to one embodiment of the present invention gradually decreases as the polishing step approaches the final polishing step. In particular, a ratio of the content of the basic compound in the polishing composition $S_p$ to the content of the basic compound in the polishing composition $S_f$ (each of $S_{fp}$ and $S_{ff}$) is preferably in a range of twice or more and 20 times or less.

[Hydroxyethyl Cellulose (HEC)]

Each of the polishing compositions that can be used in one embodiment of the present invention, including the polishing composition $S_{ff}$, the polishing composition $S_{fp}$, the polishing composition $S_p$, and the polishing composition $S_i$, may contain hydroxyethyl cellulose. Among these polishing compositions, the polishing composition $S_{ff}$ preferably contains hydroxyethyl cellulose.

In the case of the above condition (B), the polishing composition $S_{ff}$ contains hydroxyethyl cellulose. Furthermore, in this case, except for the polishing composition $S_{ff}$, each of the polishing compositions used in one embodiment of the present invention, including the polishing composition $S_{fp}$, the polishing composition $S_p$, and the polishing composition $S_i$, may contain hydroxyethyl cellulose.

Hydroxyethyl cellulose has a function of reducing the haze on the surface of the object to be polished.

A weight average molecular weight of hydroxyethyl cellulose is not particularly limited, and is preferably 2,000 or more, more preferably 10,000 or more, and further preferably 50,000 or more. Within this range, the polishing removal rate is improved. Furthermore, the weight average molecular weight of hydroxyethyl cellulose is not particularly limited, and is preferably 1,000,000 or less, more preferably 800,000 or less, and further preferably 500,000 or less. Within this range, the effect of reducing the haze of the object to be polished is improved. The weight average molecular weight can be measured by gel permeation chromatography (GPC). Specifically, values measured by the method described in Examples can be adopted.

A content of hydroxyethyl cellulose in the polishing composition $S_{ff}$ is not particularly limited, and is preferably more than 0.00001% by weight, more preferably 0.0005% by weight or more, and further preferably 0.001% by weight or more with respect to the total weight of the polishing composition. Within this range, the effect of reducing the haze of the object to be polished is improved. Furthermore, the content of hydroxyethyl cellulose in the polishing composition $S_{ff}$ is not particularly limited, and is preferably 1% by weight or less, more preferably 0.1% by weight or less, and further preferably 0.01% by weight or less with respect to the total weight of the polishing composition. Within this range, the effect of reducing the number of defects of the object to be polished is improved.

The polishing composition $S_{fp}$ and the polishing composition $S_i$ preferably contain substantially no hydroxyethyl cellulose. The polishing composition $S_p$ may contain hydroxyethyl cellulose, and the content thereof is not particularly limited. However, from the viewpoint of polishing removal rate, the smaller the content of hydroxyethyl cellulose, the more preferable, and it is more preferable that hydroxyethyl cellulose is substantially not contained.

[Water-Soluble Polymer]

The polishing compositions used in each polishing step and each polishing sub-step in the polishing method according to one embodiment of the present invention each may contain a water-soluble polymer. The water-soluble polymer has a function of imparting wettability to the object to be polished after polishing to suppress adhesion of dust, a function of protecting the surface of the object to be polished to improve the effect of reducing the number of defects and the haze, which is provided by the present invention, and the like.

In the present specification, the expression "water-soluble" means that solubility in water (25° C.) is g/100 mL or more, and the "polymer" refers to a (co)polymer whose weight average molecular weight is 2,000 or more. The weight average molecular weight can be measured by gel permeation chromatography (GPC). Specifically, values measured by the method described in Examples can be adopted. In the present specification, it is assumed that the water-soluble polymer described here does not contain hydroxyethyl cellulose regardless of the solubility and molecular weight.

The weight average molecular weight of the water-soluble polymer is 2,000 or more, preferably 10,000 or more, and more preferably 150,000 or more. Within this range, the polishing removal rate is improved. Furthermore, the weight average molecular weight of the water-soluble polymer is not particularly limited, and is preferably 1,000,000 or less, more preferably 800,000 or less, and further preferably 500,000 or less. Within this range, the effect of reducing the haze and defects of the object to be polished is improved.

The water-soluble polymer is not particularly limited, and examples thereof include a polymer containing in its molecule a hydroxyl group, a carboxyl group, an acyloxy group, a sulfo group, a vinyl structure, a polyoxyalkylene structure, a partial structure containing a nitrogen atom, and the like, and the like. Among these polymers, a polymer having a hydroxyl group in the molecule or a polymer having a partial structure containing a nitrogen atom in the molecule is preferable, and the polymer having a partial structure containing a nitrogen atom in the molecule is more preferable.

The polymer having a hydroxyl group in the molecule, which is one of preferable water-soluble polymers, is not particularly limited, and examples thereof include a polymer having an oxyalkylene unit, a polymer having a structural unit derived from vinyl alcohol, and the like.

The polymer having an oxyalkylene unit is not particularly limited, and examples thereof include polyethylene oxide (PEO), a block copolymer of ethylene oxide (EO) and propylene oxide (PO), a random copolymer of EO and PO, and the like.

The polymer having a structural unit derived from vinyl alcohol is a polymer having a vinyl alcohol unit (structural portion represented by —$CH_2$—CH(OH)—; hereinafter also referred to as "VA unit") in one molecule. Further, the polymer having a structural unit derived from vinyl alcohol may be a copolymer containing a non-vinyl alcohol unit (constituent unit derived from a monomer other than vinyl alcohol; hereinafter also referred to as "non-VA unit") in addition to the VA unit. The non-VA unit is not particularly limited, and examples thereof include a constituent unit derived from ethylene, and the like. When the polymer having a structural unit derived from vinyl alcohol contains the non-VA unit, the polymer may have only one kind of non-VA unit, or may also have two or more kinds of non-VA units. A content ratio (molar ratio) of the VA unit and the non-VA unit is not particularly limited, and, for example, VA unit:non-VA unit (molar ratio) is preferably 1:99 to 99:1. The polymer having a structural unit derived from vinyl alcohol is not particularly limited, and examples thereof include polyvinyl alcohol (PVA), vinyl alcohol/ethylene copolymer, and the like. A degree of saponification of polyvinyl alcohol is not particularly limited, and is preferably 80% or more and 100% or less.

Among the polymers having a hydroxyl group, the polymer having a structural unit derived from vinyl alcohol is preferable, and polyvinyl alcohol (PVA) is more preferable, from the viewpoint of availability and the function of the water-soluble polymer.

The polymer having a partial structure containing a nitrogen atom, which is the other preferable water-soluble polymer, is not particularly limited, and examples thereof include polymers having a nitrogen-containing heterocyclic structure such as poly N-acryloylmorpholine (PACMO), poly N-vinylpyrrolidone (PVP), poly N-vinylimidazole (PVI), poly N-vinylcarbazole, poly N-vinylcaprolactam, poly N-vinylpiperidine, and the like, and the like. Among these polymers, poly N-acryloyl morpholine (PACMO) or poly N-vinylpyrrolidone (PVP) is preferable from the viewpoint of availability, the effect of reducing the number of defects and the haze, and the like.

The water-soluble polymers can be used singly as one species or in a combination of two or more species.

In the water-soluble polymer that can be contained in the polishing composition used in the polishing method according to one embodiment of the present invention, preferred type and content range vary depending on the purpose of polishing in each polishing step.

The polishing composition $S_f$ ($S_{fp}$ and $S_{ff}$) and the polishing composition $S_i$ preferably each contain a water-soluble polymer. The lower limit of a content of the water-soluble polymer in the polishing composition $S_f$ ($S_{fp}$ and $S_{ff}$) and the polishing composition $S_i$ is not particularly limited, and is each preferably more than 0.001% by weight with respect to the total weight of the polishing composition. The upper limit of the content of the water-soluble polymer in the polishing composition $S_f$ ($S_{fp}$ and $S_{ff}$) and the polishing composition $S_i$ is not particularly limited, and is each preferably 1% by weight or less, more preferably 0.5% by weight or less, and further preferably 0.1% by weight or less with respect to the total weight of the polishing composition. Within this range, the effect of reducing the number of defects and the haze of the object to be polished is improved. Here, when two or more water-soluble polymers are used, the content means a total amount of these water-soluble polymers.

On the other hand, the content of the water-soluble polymer in the polishing composition $S_p$ is not particularly limited, the smaller the content, the more preferable, and it is more preferable that the water-soluble polymer is substantially not contained. In the present specification, "containing substantially no water-soluble polymer" means a case where a content of water-soluble polymer is 0.001% by weight or less with respect to the total weight of the polishing composition.

[Surfactant]

The polishing compositions used in each polishing step and each polishing sub-step in the polishing method according to one embodiment of the present invention each may contain a surfactant. The surfactant has a function of improving the effect of reducing the number of defects and the haze, which is provided by the present invention, by protecting the surface of the object to be polished.

In the present specification, the upper limit of the molecular weight of the surfactant is less than 2,000, preferably 1,000 or less, and more preferably 500 or less, from the viewpoint of functional expression as a surfactant. The lower limit of the molecular weight of the surfactant is not particularly limited, and is preferably 200 or more from the same viewpoint. The molecular weight can be calculated from a sum of atomic weights, and those having a molecular weight distribution such as a polymer and the like can be measured by gel permeation chromatography (GPC). When the molecular weight is measured by GPC, specifically, values measured by the method described in Examples can be adopted.

The surfactant is not particularly limited, and known surfactants such as nonionic surfactants, cationic surfactants, and anionic surfactants can be used. Among these surfactants, a nonionic surfactant is preferable from the viewpoint of the effect of reducing the number of defects and the haze, and the like.

The nonionic surfactant is not particularly limited, and examples thereof include alkylbetaine, alkylamine oxide, polyoxyethylene alkyl ether, polyoxyalkylene alkyl ether, sorbitan fatty acid ester, glycerin fatty acid ester, polyoxyethylene fatty acid ester, polyoxyethylene alkylamine, alkylalkanolamide, and the like. Among these surfactants, from the viewpoint of improving the dispersion stability of the polishing composition, polyoxyalkylene alkyl ether is preferable, polyoxyethylene alkyl ether is more preferable, and polyoxyethylene decyl ether is further preferable.

The surfactants can be used singly as one species or in a combination of two or more species.

In the surfactant that can be contained in the polishing composition used in each polishing step and each polishing sub-step in the polishing method according to one embodiment of the present invention, preferred type and content range vary depending on the purpose of polishing in each polishing step.

The polishing composition $S_f$ ($S_{fp}$ and $S_{ff}$) and the polishing composition $S_i$ preferably each contain a surfactant. The lower limit of a content of the surfactant in the polishing composition $S_f$ ($S_{fp}$ and $S_{ff}$) and the polishing composition $S_i$ is not particularly limited, and is each preferably more than 0.00001% by weight, more preferably 0.00005% by weight or more, and further preferably 0.0001% by weight or more with respect to the total weight of the polishing composition. A preferable range of the content of the surfactant in the polishing composition $S_f$ ($S_{fp}$ and $S_{ff}$) and the polishing composition $S_i$ is not particularly limited, and is preferably 0.1% by weight or less, more preferably 0.05% by weight or less, and further preferably 0.001% by weight or less with respect to the total weight of the polishing composition. Within this range, the effect of reducing the number of defects and the haze of the object to be polished is improved. Here, when two or more surfactants are used, the content means a total amount of these surfactants.

On the other hand, the content of the surfactant in the polishing composition $S_p$ is not particularly limited, the smaller the content, the more preferable, and it is more preferable that the surfactant is substantially not contained. In the present specification, "containing substantially no surfactant" means a case where a content of surfactant is 0.00001% by weight or less with respect to the total weight of the polishing composition.

[Dispersing Medium]

The polishing compositions used in each polishing step and each polishing sub-step in the polishing method according to one embodiment of the present invention each preferably contain a dispersing medium (solvent). The dispersing medium has a function of dispersing or dissolving each component.

The dispersing medium can be used singly as one species or in a combination of two or more species.

The dispersing medium is not particularly limited, and preferably contains water. The content of water in the dispersing medium is not particularly limited, and is preferably 50% by weight or more, and more preferably 90% by weight or more with respect to a total weight of the dispersing medium, and it is more preferable that only water is contained. As the water, water that does not contain impurities as much as possible is preferable from the viewpoint of preventing contamination of the object to be polished and inhibition of a function of other components. For example, it is preferred that water has a total content of transition metal ions of 100 ppb or less. Here, the purity of water can be increased, for example, by removal of impurity ions using an ion exchange resin, removal of foreign substances by a filter, or operation such as distillation. Specifically, it is preferable to use for example, deionized water (ion exchange water), pure water, ultrapure water, distilled water, or the like, as water.

The dispersing medium may be an organic solvent or a mixed solvent of water and an organic solvent as long as the dispersibility or solubility of each component can be improved. The organic solvent is not particularly limited, and a known organic solvent can be used. When the mixed solvent of water and an organic solvent is used, acetone, acetonitrile, ethanol, methanol, isopropanol, glycerin, ethylene glycol, propylene glycol, and the like, which are organic solvents mixed with water, are preferably used. When an organic solvent is used, water and an organic solvent may be mixed, and each component may be added and dispersed or dissolved in the obtained mixed solvent, or these organic solvents may be used without being mixed with water, and after dispersing or dissolving each component, the organic solvents may be mixed with water. These organic solvents may be used either individually or in combination of two or more.

[Other Components]

The polishing compositions used in each polishing step and each polishing sub-step in the polishing method according to one embodiment of the present invention may each contain other components as long as the effects of the present invention are not impaired. The other components are not particularly limited, and, for example, components used in known polishing compositions such as acids, chelating agents, antiseptic agents, antifungal agents, dissolved gases, reducing agents, and the like can be appropriately selected.

[pH]

The lower limit of pH of the polishing compositions used in each polishing step and each polishing sub-step in the polishing method according to one embodiment of the present invention is not particularly limited, and is each preferably 7 or more, more preferably 8 or more, and further preferably 9 or more. Within this range, the polishing removal rate is improved. The lower limit of these pH is not particularly limited, and is each preferably less than 12.5, more preferably 12 or less, further preferably 11 or less, and particularly preferably 10.6 or less. Within this range, the effect of reducing the number of defects and the haze is improved.

The pH can be confirmed with a pH meter (trade name: LAQUA (registered trademark) manufactured by HORIBA, Ltd.).

The pH can be controlled by the type and added amount of the basic compound, the type and added amount of the acid which is the other component that can be arbitrarily added, or the like.

[Method of Producing Polishing Composition]

A method of producing the polishing compositions used in each polishing step and each polishing sub-step in the polishing method according to one embodiment of the present invention is not particularly limited as long as the method includes mixing each component contained in the polishing composition described above.

The mixing method used when mixing each component is not particularly limited, and a known method can be appropriately used. A mixing temperature is not particularly limited, and is generally preferably 10 to 40°, and heating may be performed to increase a rate of dissolution. The mixing time is also not particularly limited.

(Polishing Apparatus and Polishing Conditions)

In each polishing step or each polishing sub-step included in the polishing step according to one embodiment of the present invention, a polishing apparatus used and the polishing conditions that can be adopted will be described.

As the polishing apparatus, it is possible to use a general polishing apparatus provided with a holder for holding a substrate or the like having an object to be polished, a motor or the like which can change a rotation speed, and a polishing platen to which a polishing pad (polishing cloth) can be attached. For example, a single side polishing apparatus or a double side polishing apparatus can be used.

When the object to be polished is polished using the single side polishing apparatus, the object to be polished is held using a holder called a carrier, and a platen is rotated while a platen attached with a polishing pad (polishing cloth) is pressed against one side of the object to be polished and the polishing composition is supplied, whereby one side of the object to be polished is polished.

When the object to be polished is polished using the double side polishing apparatus, the object to be polished is held using the holder called a carrier, and the platens on both sides are rotated while the platen attached with the polishing pad (polishing cloth) is pressed against both sides of the object to be polished from both sides of the object to be polished and the polishing composition is supplied, whereby both sides of the object to be polished is polished.

As the polishing pad, a general non-woven fabric type, a polyurethane type, a suede type, or the like can be used without particular limitation. The polishing pad is preferably groove-processed such that the polishing composition can be stored therein.

Regarding the polishing conditions, regardless of whether a certain polishing step is classified into the preliminary polishing step $P_p$, the intermediate polishing step $P_i$, the final polishing step $P_f$, or other polishing step, the preferred range will differ depending on the purpose of polishing in each polishing step or each polishing sub-step. Thus, the polishing conditions are not particularly limited, and suitable conditions can be adopted according to the purpose of polishing in each polishing step or each polishing sub-step.

Although the polishing processing may be either single side polishing or double side polishing, single side polishing is preferable.

The platen (polishing platen) rotation speed and the head (carrier) rotation speed are not particularly limited, and are preferably 10 rpm or more and 100 rpm or less. In particular, in the preliminary polishing step $P_p$, the rotation speeds are more preferably 15 rpm or more and 80 rpm or less. In the final polishing step $P_f$, the rotation speeds are more preferably 20 rpm or more and 60 rpm or less, and further preferably 25 rpm or more and 55 rpm or less. Within this range, the effect of reducing the number of defects and the haze of the object to be polished is improved, and the production efficiency is also improved. Although the platen (polishing platen) rotation speed and the head (carrier) rotation speed may be the same or different, it is preferable that the platen (polishing platen) rotation speed and the head (carrier) rotation speed are set to the same relative speed with respect to the object to be polished.

The object to be polished is usually pressurized by a platen. A pressure (polishing load) at this time is not particularly limited, and is preferably 5 kPa or more and 30 kPa or less. In particular, in the preliminary polishing step $P_p$, the pressure is more preferably 5 kPa or more and 30 kPa or less, and further preferably 10 kPa or more and 25 kPa or less. In the final polishing step $P_f$, the pressure is more preferably 10 kPa or more and 20 kPa or less. Within this range, the effect of reducing the number of defects and the haze of the object to be polished is improved, and the production efficiency is also improved.

Each polishing composition may be in a concentrated form before supplied to the object to be polished. The concentrated form is a form of a concentrate of the polishing composition, and can be grasped as a stock solution of the polishing composition. A polishing liquid in a concentrated form as this is advantageous from the viewpoint of the convenience, cost reduction and the like for production, distribution, storage, etc. A concentration factor is not particularly limited and can be set to, for example, about 2 times to 100 times by volume, and usually, it is suitable that the concentration factor is about 5 times to 50 times by volume, for example, about 10 times to 40 times by volume.

Such a concentrate can be used in an aspect where it is diluted whenever desired to prepare a polishing composition and the polishing composition is supplied to an object to be polished. The dilution can be carried out, for example, by adding and mixing water with the concentrate.

Although the supply flow rate of the polishing composition is not particularly limited because it can be appropriately selected according to a size of the polishing platen, the supply flow rate that covers the entire object to be polished is preferable, and considering economic efficiency, the supply flow rate is more preferably 0.1 L/min or more and 5 L/min or less, and further preferably 0.2 L/min or more and 2 L/min or less. Within this range, the effect of reducing the number of defects and the haze of the object to be polished is improved, and the production efficiency is also improved.

The method of supplying the polishing composition is not particularly limited, and a method (one-way) in which the polishing composition is continuously supplied by a pump or the like may be adopted.

Although the holding temperature of the polishing composition in the polishing apparatus is also not particularly limited, from the viewpoint of stability of polishing removal rate and the effect of reducing the number of defects and the haze of the object to be polished, the holding temperature is preferably 15° C. or more and 40° C. or less, and more preferably 18° C. or more and 25° C. or less.

The polishing composition is collected after being used for polishing the object to be polished, if necessary, each component that can be contained in the polishing composition is added to adjust the composition, and then the polishing composition may be reused for polishing the object to be polished.

Regarding the above polishing apparatus and polishing conditions, only one example has been described, but the polishing conditions may deviate from the above ranges, and the setting may be appropriately changed. Such conditions can be appropriately set by those skilled in the art.

After polishing, it is preferable to perform cleaning processing of the polishing object. A cleaning method is not particularly limited, and as a preferable example, there is a method of immersing the polishing object for 6 minutes in a cleaning solution prepared by mixing in a volume ratio of 29% by weight concentration ammonia water: 31% by weight concentration hydrogen peroxide solution: deionized water (DIW)=2: 5.4: 20 or in a volume ratio of 29% by weight concentration ammonia water: 31% by weight concentration hydrogen peroxide solution: deionized water (DIW)=1: 1: 12. Immersion in the cleaning solution is preferably performed in a state in which the ultrasonic oscillator is operated. The temperature of the cleaning solution is not particularly limited, and is preferably in a range of 40° C. or more and 80° C. or less. Then, after cleaning with the cleaning solution, it is preferable to further immerse the polishing object in deionized water (DIW). After cleaning, it is preferable to dry the polishing object using a known drying device such as a spin dryer.

<Polishing Composition Set>

Another embodiment of the present invention relates to a polishing composition set including the polishing composition $S_{ff}$ or its concentrate used in the final polishing sub-step $P_{ff}$ in the final polishing step $P_f$ and the polishing composition $S_{fp}$ or its concentrate used in the polishing sub-step $P_{fp}$ provided before the polishing sub-step $P_{ff}$, in which the value of the haze parameter of the polishing composition $S_{ff}$ obtained in the above standard test 1 is smaller than the value of the haze parameter of the polishing composition $S_{fp}$ obtained in the standard test 1 (that is, the above condition (A) is satisfied). According to one embodiment of the present invention, there is provided means capable of achieving both a reduction in the number of defects and a reduction in haze in an object to be polished after polishing at a high level in a method of polishing the object to be polished containing a material having a silicon-silicon bond.

Here, when the polishing composition set contains the concentrate of the polishing composition $S_{ff}$ and the above condition (A) is satisfied, the concentrate of the polishing composition $S_{ff}$ is selected from concentrates in which the value of the haze parameter of the diluted polishing composition $S_{ff}$ obtained in the standard test satisfies the above range.

Another embodiment of the present invention relates to a polishing composition set including the polishing composition $S_{ff}$ or its concentrate used in the final polishing sub-step $P_{ff}$ in the final polishing step $P_f$ and the polishing composition $S_{fp}$ or its concentrate used in the polishing sub-step $P_{fp}$ provided before the polishing sub-step $P_{ff}$, in which the polishing composition $S_{ff}$ or its concentrate contains the abrasive $A_{ff}$, the basic compound $B_{ff}$, and hydroxyethyl cellulose (that is, the above condition (B) is satisfied). According to one embodiment of the present invention, there is provided means capable of achieving both a reduction in the number of defects and a reduction in haze in an object to be polished after polishing at a high level in a method of polishing the object to be polished containing a material having a silicon-silicon bond.

The polishing composition set according to one embodiment of the present invention preferably satisfies both the above condition (A) and the above condition (B).

According to one embodiment of the present invention, a polishing composition set that can be preferably used in the polishing method described above can be provided. The polishing composition set includes at least the polishing composition $S_{ff}$ and the polishing composition $S_{fp}$ that are stored separately from each other. Here, the polishing composition $S_{ff}$ may be in a concentrated form (concentrate), and the polishing composition $S_{fp}$ may also be a concentrate.

In the polishing composition set, the polishing composition $S_{ff}$ or its concentrate, the polishing composition $S_{fp}$ or its concentrate, and any other polishing composition or its concentrate that may be used are stored separately from each other.

In the polishing composition set, it is preferable that the polishing composition $S_{fp}$ or its concentrate contains the abrasive $A_{fp}$ and the basic compound $B_{fp}$ and contains substantially no hydroxyethyl cellulose.

It is preferable that the polishing composition set according to one embodiment of the present invention further contains the polishing composition $S_p$ used in the preliminary polishing step $P_p$. Here, the polishing composition $S_p$ may be a concentrate. In the polishing composition set, the polishing composition $S_p$ or its concentrate, the polishing composition $S_{ff}$ or its concentrate, the polishing composition $S_{fp}$ or its concentrate, and any other polishing composition or its concentrate that may be used (for example, polishing composition $S_i$ or its concentrate, or the like) are stored separately from each other.

It is preferable that the polishing composition set according to one embodiment of the present invention further contains the polishing composition $S_i$ used in the intermediate polishing step $P_i$. Here, the polishing composition $S_i$ may be a concentrate. In the polishing composition set, the polishing composition $S_i$ or its concentrate, the polishing composition $S_{ff}$ or its concentrate, the polishing composition $S_{fp}$ or its concentrate, and any other polishing composition or its concentrate that may be used (for example, polishing composition $S_p$ or its concentrate, or the like) are stored separately from each other.

Here, respective details of the polishing composition $S_{ff}$, the polishing composition $S_{fp}$, the polishing composition $S_p$, and the polishing composition $S_i$ are the same as those described in the above polishing method. Respective details of the final polishing step $P_f$ (polishing sub-step $P_{ff}$ and polishing sub-step $P_{fp}$), the preliminary polishing step $P_p$, and the intermediate polishing step $P_i$ are as described in the above polishing method.

The polishing method disclosed above can be suitably carried out using such a polishing composition set. Therefore, the polishing composition set can be preferably used in the polishing method disclosed above, a method of producing a polished product (polished object to be polished) including carrying out the polishing method, and the like.

Each polishing composition constituting the polishing composition set may be of a one-part type or a multiple-part type such as a two-part type. In the multi-part type polishing composition, for example, it may be formulated such that the polishing composition is stored by being classified into a part A containing at least an abrasive of the components of each polishing composition and a part B containing the remaining components and the part A and the part B are mixed to be diluted at a suitable timing as needed, and thus to prepare the polishing composition.

Although the embodiment of the present invention has been described in detail, this is descriptive and exemplary but not limiting, and it is clear that the scope of the invention should be construed by the appended claims.

The present invention includes the following aspects and embodiments:

1. a method of polishing an object to be polished containing a material having a silicon-silicon bond, the polishing method including a final polishing step $P_f$,
   in which the final polishing step $P_f$ has a plurality of polishing sub-steps,
   the plurality of polishing sub-steps are continuously performed on the same polishing platen,
   a final polishing sub-step in the plurality of polishing sub-steps is a polishing sub-step $P_{ff}$ of polishing using a polishing composition $S_{ff}$,
   a polishing sub-step provided before the polishing sub-step $P_{ff}$ in the plurality of polishing sub-steps is a polishing sub-step $P_{fp}$ of polishing using a polishing composition $S_{fp}$, and
   the polishing composition $S_{ff}$ satisfies at least one selected from the group consisting of the following condition (A) and the following condition (B):
   condition (A): a value of a haze parameter of the polishing composition $S_{ff}$ obtained in a standard test 1 is smaller than a value of the haze parameter of the polishing composition $S_{fp}$ obtained in the standard test 1, and
   condition (B): the polishing composition $S_{ff}$ contains an abrasive $A_{ff}$, a basic compound $B_{ff}$, and hydroxyethyl cellulose;

2. the polishing method according to the above 1, wherein the polishing composition $S_{fp}$ contains an abrasive $A_{fp}$ and a basic compound $B_{fp}$;

3. the polishing method according to the above 2, wherein an average primary particle diameter of the abrasive $A_{fp}$ is 5 nm or more and less than 35 nm;

4. the polishing method according to any one of the above 1 to 3, wherein when D90 of particles present in the polishing composition $S_{fp}$, which is measured by a dynamic light scattering method, is $R1_{fp}$, and D90 of the particles present in the polishing composition $S_{fp}$ after adjusting the pH to 12.5 using potassium hydroxide and stirring for 30 minutes, which is measured by the dynamic light scattering method, is $R2_{fp}$, $R1_{fp}/R2_{fp}$ is 1.25 or less;

5. the polishing method according to any one of the above 1 to 4, wherein the polishing composition $S_{fp}$ contains substantially no hydroxyethyl cellulose;

6. the polishing method according to any one of the above 1 to 5, wherein in the condition (A), the polishing composition $S_{ff}$ contains the abrasive $A_{ff}$ and the basic compound $B_{ff}$;

7. the polishing method according to the above 6, wherein in the condition (A), the average primary particle diameter of the abrasive $A_{ff}$ is 5 nm or more and less than 35 nm;

8. the polishing method according to any one of the above 1 to 5, wherein in the condition (B), the average primary particle diameter of the abrasive $A_{ff}$ is 5 nm or more and less than 35 nm;

9. the polishing method according to any one of the above 1 to 8, wherein when D90 of particles present in the polishing composition $S_{ff}$, which is measured by the dynamic light scattering method, is $R1_{ff}$, and D90 of the particles present in the polishing composition $S_{ff}$ after adjusting the pH to 12.5 using potassium hydroxide and stirring for 30 minutes, which is measured by the dynamic light scattering method, is $R2_{ff}$, $R1_{ff}/R2_{ff}$ is more than 1.25;

10. the polishing method according to any one of the above 1 to 9, wherein a polishing time of the polishing sub-step $P_{ff}$ is more than 0 second and 80 seconds or less;

11. the polishing method according to any one of the above 1 to 10, wherein the polishing time of the polishing sub-step $P_{fp}$ is 20 seconds or more and 450 seconds or less;

12. the polishing method according to any one of the above 1 to 11, further including a preliminary polishing step $P_p$ before the final polishing step $P_f$, wherein the preliminary polishing step $P_p$ is a step of polishing using the polishing composition $S_p$ in which a polishing removal rate obtained in a standard test 2 is 50 nm/min or more, the final polishing step $P_f$ is a step of polishing using the polishing composition $S_f$ in which the polishing removal rate obtained in the standard test 2 is more than 0 nm/min and less than 50 nm/min, and both the polishing composition $S_{ff}$ and the polishing composition $S_{fp}$ correspond to the polishing composition $S_f$;

13. the polishing method according to the above 12, wherein the polishing composition $S_p$ contains an abrasive $A_p$ and a basic compound $B_p$;

14. the polishing method according to the above 12 or 13, wherein when D90 of particles present in the polishing composition $S_p$, which is measured by the dynamic light scattering method, is $R1_p$, and D90 of the particles present in the polishing composition $S_p$ after adjusting the pH to 12.5 using potassium hydroxide and stirring for 30 minutes, which is measured by the dynamic light scattering method, is $R2_p$, $R1_p/R2_p$ is 1.25 or less;

15. the polishing method according to any one of the above 12 to 14, further including an intermediate polishing step $P_i$ between the final polishing step $P_f$ and the preliminary polishing step $P_p$, wherein the intermediate polishing step $P_i$ is a step of polishing using a polishing composition $S_i$ in which the polishing removal rate obtained in the standard test 2 is more than 0 nm/min and less than 50 nm/min, the polishing composition $S_i$ contains an abrasive $A_i$ and a basic compound $B_i$ and contains substantially no hydroxyethyl cellulose, when D90 of the particles present in the polishing composition $S_i$, which is measured by the dynamic light scattering method, is $R1_i$, and D90 of the particles present in the polishing composition $S_i$ after adjusting the pH to 12.5 using potassium hydroxide and stirring for 30 minutes, which is measured by the dynamic light scattering method, is $R2_i$, $R1_i/R2_i$ is 1.25 or less;

16. the polishing method according to the above 15, wherein a total polishing time of the intermediate polishing step $P_i$ and the polishing sub-step $P_{fp}$ is 20 seconds or more and 450 seconds or less;

17. a polishing composition set including a polishing composition $S_{ff}$ or its concentrate used in a final polishing sub-step $P_{ff}$ in a final polishing step $P_f$, and a polishing composition $S_{fp}$ or its concentrate used in a polishing sub-step $P_{fp}$ provided before the polishing sub-step $P_{ff}$, wherein the polishing composition $S_{ff}$ or its concentrate satisfies at least one selected from the group consisting of the following condition (A) and the following condition (B):

condition (A): a value of a haze parameter of the polishing composition $S_{ff}$ obtained in a standard test 1 is smaller than a value of the haze parameter of the polishing composition $S_{fp}$ obtained in the standard test 1, and condition (B): the polishing composition $S_{ff}$ contains an abrasive $A_{ff}$, a basic compound $B_{ff}$, and hydroxyethyl cellulose;

18. the polishing composition set according to the above 17, wherein the polishing composition $S_{fp}$ or its concentrate contains an abrasive $A_{fp}$ and a basic compound $B_{fp}$ and contains substantially no hydroxyethyl cellulose;

19. the polishing composition set according to the above 17 or 18, further including a polishing composition $S_p$ or its concentrate used in a preliminary polishing step $P_p$;

20. the polishing composition set according to any one of the above 17 to 19, further including a polishing composition $S_i$ or its concentrate used in an intermediate polishing step $P_i$.

EXAMPLES

The present invention will be described in more detail with reference to the following Examples and Comparative Examples. However, the technical scope of the present invention is not limited to only the following Examples. Unless specifically described otherwise, "%" and "parts" indicate "% by weight" and "parts by weight", respectively.

<Provision of Polishing Composition>

(Preparation of Polishing Composition)

Polishing compositions A, B, and C were respectively prepared by mixing the following materials in deionized water (DIW) so as to have the composition shown in Table 1 below. In addition, the pH of these polishing compositions was measured by a method described later.

Abrasive

Silica 1: colloidal silica, average primary particle diameter by BET method: 25 nm, Silica 2: colloidal silica, average primary particle diameter by BET method: 35 nm.

Basic Compound $NH_3$: ammonia water (concentration 29% by weight, values described in Table 1 are in terms of ammonia amount), KOH: potassium hydroxide.

Hydroxyethyl Cellulose

HEC: hydroxyethyl cellulose (weight average molecular weight: 280,000).

Water-Soluble Polymer

PVA: polyvinyl alcohol (weight average molecular weight: 70,000, saponification degree 98% or more), PACMO: poly N-acryloyl morpholine (weight average molecular weight: 350,000), PVP: poly N-vinylpyrrolidone (weight average molecular weight: 17,000).

Surfactant

C-PEO: polyoxyethylene decyl ether (weight average molecular weight: 400).

(Weight Average Molecular Weight)

The weight average molecular weights of hydroxyethyl cellulose, the water-soluble polymer, and the surfactant were measured using the GPC method under the following conditions:

<<GPC Measurement Conditions>>

Apparatus: HLC-8320GPC, manufactured by Tosoh Corporation,

Column: TSK-gel GMPWXL,

Solvent: 100 mM aqueous sodium nitrate solution/acetonitrile=10 to 8/0 to 2 (volume ratio), Sample concentration: 0.1% by weight, Flow rate: 1 mL/min, Injection amount: 200 µL, Measurement temperature: 40° C., Molecular weight conversion: polyethylene glycol conversion, Detector: differential refractometer (RI).

(Haze Parameter of Each Polishing Composition Obtained in Standard Test 1)

[Standard Polishing Step 1]

A single crystal silicon wafer (diameter: 300 mm, p-type, crystal orientation <100>, COP free) was subjected to single side polishing on a polishing platen of the following polishing machine using the above-prepared polishing composition C under the following polishing condition 1:

<<Polishing Condition 1 (Pre-Polishing)>>

Polishing machine: single-wafer polishing machine PNX-332B (manufactured by Okamoto Machine Tool Works, Ltd.), Polishing pad: SUBA400 (pad in which non-woven fabric substrate is impregnated with polyurethane resin, thickness 1.27 mm, hardness 60 (Asker C), compression rate 9.4%, manufactured by Nitta Haas Incorporated), Polishing platen: polishing platen 1, Polishing pressure: 19 kPa, Platen (polishing platen) rotation speed: 32 rpm, Head (carrier) rotation speed: 30 rpm, Polishing liquid: the above-prepared polishing composition C, Supply flow rate of polishing liquid: 1.0 liter/min (one-way), Polishing time: 160 sec, Temperature of platen cooling water: 20° C., Holding temperature of polishing liquid: 20° C.

The polished surface of the silicon wafer after polishing under the polishing condition 1 of the above polishing step was subjected to single side polishing on a polishing platen 2, which was a polishing platen different from that in polishing processing 1 of the same polishing machine, using the prepared polishing composition A or B under the following polishing condition 2:

<<Polishing Condition 2 (Post-Polishing)>>

Polishing machine: single-wafer polishing machine PNX-332B (manufactured by Okamoto Machine Tool Works, Ltd.)

Polishing pad: POLYPAS (registered trademark) 27NX (suede type, thickness about 1.5 mm, density about 0.4 $g/cm^3$, compression rate about 20%, compressive elastic modulus about 90%, hardness about 40° (Shore A (Durometer A type)), average opening diameter about 45 µm, opening rate about 25%, manufactured by Fujibo Ehime Co., Ltd.)

Polishing platen: polishing platen 2,

Polishing pressure: 16 kPa,

Platen (polishing platen) rotation speed: 30 rpm,

Head (carrier) rotation speed: 30 rpm,

Supply flow rate of polishing composition: 2.0 liters/min (one-way),

Polishing liquid: the above-prepared polishing composition A or B,

Polishing time: 160 sec,

Temperature of platen cooling water: 20° C.,

Holding temperature of polishing liquid: 20° C.

[Cleaning Processing]

In the state in which the ultrasonic oscillator was operated, the silicon wafer after polishing under the polishing condition 2 of the above polishing step was cleaned by being immersed for 6 minutes in a cleaning solution prepared by mixing in a volume ratio of 29% by weight concentration ammonia water:31% by weight concentration hydrogen peroxide solution:deionized water (DIW)=2:5.4:20. The temperature of the cleaning solution was about 70° C. Then, the silicon wafer was immersed in deionized water (DIW) and then dried.

[Calculation of Haze Parameter]

The haze (%) of the silicon wafer after the cleaning processing was measured by the DWO mode using "Surfscan SP2$^{XP}$" manufactured by KLA-Tencor Corporation. The haze parameter was evaluated with a relative value with the haze (%) of the silicon wafer after polishing by the polishing composition A as 100. These values are shown as standard haze parameters in Table 2 below.

(Polishing Removal Rate of Each Polishing Composition Obtained in Standard Test 2)

[Pretreatment]

A single crystal silicon wafer (diameter: 200 mm, p-type, crystal orientation <100>, COP free) was prepared, and the weight before polishing was measured. Subsequently, the silicon wafer was immersed in a 2% by weight HF (hydrogen fluoride) aqueous solution for 30 seconds and rinsed with deionized water to perform pretreatment.

[Standard Polishing Step]

The silicon wafer after the pretreatment was subjected to single side polishing using the prepared polishing composition A, B, or C under the following polishing conditions:

<<Polishing Condition>>

Polishing machine: single-wafer polishing machine PNX-322 (manufactured by Okamoto Machine Tool Works, Ltd.)

Polishing pad: POLYPAS (registered trademark) 27NX (suede type, thickness about 1.5 mm, density about 0.4 g/cm$^3$, compression rate about 20%, compressive elastic modulus about 90%, hardness about 40° (Shore A (Durometer A type)), average opening diameter about 45 μm, opening rate about 25%, manufactured by Fujibo Ehime Co., Ltd.)

Polishing pressure: 15 kPa,
Platen (polishing platen) rotation speed: 30 rpm,
Head (carrier) rotation speed: 30 rpm,
Polishing liquid: the above-prepared polishing composition A, B, or C,
Supply flow rate of polishing composition (one-way): 0.4 L/min,
Polishing time: 600 sec,
Temperature of platen cooling water: 20° C.,
Holding temperature of polishing composition: 20° C.

[Cleaning Processing]

In the state in which the ultrasonic oscillator was operated, the silicon wafer after polishing by the above standard polishing step was cleaned by being immersed for 6 minutes in a cleaning solution prepared by mixing in a volume ratio of 29% by weight concentration ammonia water:31% by weight concentration hydrogen peroxide solution:deionized water (DIW)=1:1:12. The temperature of the cleaning solution was about 60° C. Then, the silicon wafer was immersed in deionized water (DIW) and then dried with a spin dryer.

[Calculation of Polishing Removal Rate]

Regarding a silicon wafer (diameter: 200 mm, p-type, crystal orientation <100>, COP free) after the washing processing, the weight after polishing was measured. Subsequently, the polishing removal rate (nm/min) was calculated from the weight difference before and after polishing the silicon wafer, the area of the polished surface of the silicon wafer, and the specific gravity of silicon. These values are shown as standard polishing removal rates in Table 2 below.

(Particle Size Change Rate R1/R2)

Regarding the above-prepared polishing composition A, B, or C, the particle diameter (D90) (nm), when the cumulative particle diameter distribution from the small particle diameter side was 90% in the volume-based particle size distribution of the particles present in the polishing composition, was measured by the dynamic light scattering method using UPA-UT151 manufactured by Nikkiso Co., Ltd., and the obtained value of D90 was defined as R1.

The pH of the above-prepared polishing composition A, B, or C was adjusted to 12.5 using potassium hydroxide, the mixture was stirred at 700 rpm for 30 minutes, D90 (nm) was then measured by the dynamic light scattering method using UPA-UT151 manufactured by Nikkiso Co., Ltd., and the obtained value of D90 was defined as R2.

The pH of the polishing composition (liquid temperature: 25° C.) was confirmed with a pH meter (trade name: LAQUA (registered trademark) manufactured by HORIBA, Ltd.). In this measurement, after 3-point calibration was performed using a standard buffer solution (phthalate pH buffer solution pH: 4.01 (25° C.), neutral phosphate pH buffer solution pH: 6.86 (25° C.), carbonate pH buffer solution pH: 10.01 (25° C.)), a glass electrode was inserted into the polishing composition (concentrate) for 2 minutes or more and stabilized, and then the value was measured.

Then, by dividing R2 from R1, the particle size change rate R1/R2 was calculated. The composition and pH of each polishing composition are shown in Table 1 below, the particle size change rate R1/R2, the haze parameter (standard haze parameter) of each polishing composition obtained in the standard test 1, and the polishing removal rate (standard polishing removal rate) of each polishing composition obtained in the standard test 2 are shown in Table 2 below. In Table 1, although PVA and PACMO are listed in the column of the water-soluble polymer of the polishing composition A, the description indicates that both PVA and PACMO are used in combination in the polishing composition.

Here, when these polishing compositions are used as the polishing compositions $S_p$, $S_{fp}$, and $S_{ff}$ as described later, the particle sizes R1 and R2 and the particle size change rate R1/R2 of these polishing compositions are respectively $R1_p$, $R2_p$ and $R1_p/R2_p$, $R1_{fp}$, $R2_{fp}$ and $R1_{fp}/R2_{fp}$, and $R1_{ff}$, $R2_{ff}$ and $R1_{ff}/R2_{ff}$.

<Polishing Method>

The silicon wafer was polished by a polishing method described in Table 3 below. The polishing conditions in each polishing step are shown below.

(Preliminary Polishing Step $P_p$)

A single crystal silicon wafer (diameter: 300 mm, p-type, crystal orientation <100>, COP free) was subjected to single side polishing on the polishing platen 1 of the following polishing machine using the above-prepared polishing composition C as the polishing composition $S_p$ under the following polishing conditions:

<<Polishing Conditions in Preliminary Polishing Step>>

Polishing machine: single-wafer polishing machine PNX-332B (manufactured by Okamoto Machine Tool Works, Ltd.), Polishing pad: SUBA400 (pad in which non-woven fabric substrate is impregnated with polyurethane resin, thickness 1.27 mm, hardness 60 (Asker C), compression rate 9.4%, manufactured by Nitta Haas Incorporated), Polishing platen: polishing platen 1,
Polishing pressure: 19 kPa,
Platen (polishing platen) rotation speed: 32 rpm,
Head (carrier) rotation speed: 30 rpm,
Polishing liquid: polishing composition $S_p$ (the above-prepared polishing composition C),
Supply flow rate of polishing liquid: 1.0 liter/min (one-way),
Polishing time: 160 sec,
Temperature of platen cooling water: 20° C.,
Holding temperature of polishing liquid: 20° C.

(Final Polishing Step $P_f$)

The polished surface of the silicon wafer after polishing by the preliminary polishing step $P_p$ was subjected to single side polishing on the polishing platen 2 of the following polishing machine under the following polishing conditions:

<<Polishing Conditions in Polishing Sub-Step $P_{fp}$>>

Polishing machine: single-wafer polishing machine PNX-332B (manufactured by Okamoto Machine Tool Works, Ltd.)

Polishing pad: POLYPAS (registered trademark) 27NX (suede type, thickness about 1.5 mm, density about 0.4 g/cm$^3$, compression rate about 20%, compressive elastic modulus about 90%, hardness about 40° (Shore A (Durometer A type)), average opening diameter about 45 μm, opening rate about 25%, manufactured by Fujibo Ehime Co., Ltd.)

Polishing platen: polishing platen 2,
Polishing pressure: 16 kPa,
Platen (polishing platen) rotation speed: 30 rpm,
Head (carrier) rotation speed: 30 rpm,
Supply flow rate of polishing composition: 2.0 liters/min (one-way), Polishing liquid: polishing composition $S_{fp}$ (the above-prepared polishing composition A or B),
Polishing time: time described in Table 3 below,
Temperature of platen cooling water: 20° C.,
Holding temperature of polishing liquid: 20° C.
<<Polishing Conditions in Polishing Sub-Step $P_{ff}$>>
Polishing machine: single-wafer polishing machine PNX-332B (manufactured by Okamoto Machine Tool Works, Ltd.),
Polishing pad: POLYPAS (registered trademark) 27NX (suede type, thickness about 1.5 mm, density about 0.4 g/cm³, compression rate about 20%, compressive elastic modulus about 90%, hardness about 40° (Shore A (Durometer A type)), average opening diameter about 45 μm, opening rate about 25%, manufactured by Fujibo Ehime Co., Ltd.)
Polishing platen: polishing platen 2,
Polishing pressure: 16 kPa,
Platen (polishing platen) rotation speed: 30 rpm,
Head (carrier) rotation speed: 30 rpm,
Supply flow rate of polishing composition: 2.0 liters/min (one-way),
Polishing liquid: polishing composition $S_{ff}$ (the above-prepared polishing composition A or B),
Polishing time: time described in Table 3 below,
Temperature of platen cooling water: 20° C.,
Holding temperature of polishing liquid: 20° C.
(Cleaning Processing)
In the state in which the ultrasonic oscillator was operated, the silicon wafer after polishing by the above final polishing step was cleaned by being immersed for 6 minutes in a cleaning solution prepared by mixing in a volume ratio of 29% by weight concentration ammonia water:31% by weight concentration hydrogen peroxide solution:deionized water (DIW)=2:5.4:20. The temperature of the cleaning solution was about 70° C. Then, the silicon wafer was immersed in deionized water (DIW) and then dried.
<Surface Quality of Silicon Wafer after Polishing>
The number of defects and the haze were evaluated as the surface quality of the silicon wafer after polishing by the polishing method described in Table 3 below.
(Number of Defects)
The number of defects (pieces) of the silicon wafer after polishing by the polishing method described in Table 3 below was evaluated according to the following method. First, using a defect detection device (wafer inspection device) Surfscan SP2$^{XP}$ manufactured by KLA-Tencor Corporation, defects of 32 nm or more on the entire wafer surface (however, the outer circumference of 2 mm was excluded, that is, portion with a width of 0 mm to 2 mm was excluded when the outer peripheral end was 0 mm) were detected together with defect coordinates. Subsequently, the defects in the detected defect coordinates were observed by Review-SEM (RS-6000, manufactured by Hitachi High-Technologies Corporation), and the number of defects was totaled. The number of defects was evaluated with a relative value with the number of defects of the silicon wafer after polishing by a polishing method 4 as 100. The lower the relative value, the more preferable the number of defects, and the number of defects is preferably 50 or less.

(Haze)

The haze (%) of the silicon wafer after polishing by the polishing method described in Table 3 below was measured by the DWO mode using "Surfscan SP2$^{XP}$" manufactured by KLA-Tencor Corporation. The haze was evaluated with a relative value with the haze (%) of the silicon wafer after polishing by the polishing method 4 as 100. The lower the relative value, the more preferable the haze, and the haze is preferably 105 or less.

Evaluation results of the number of defects and the haze of the silicon wafer after polishing by each polishing method are shown in Table 3 below.

As shown in Tables 1 to 3 below, according to the polishing method 1 or 2 which was the polishing method according to the present invention, it was confirmed that both the reduction in the number of defects and the reduction of haze of the silicon wafer could be achieved at a high level. On the other hand, according to the polishing methods 3 to 5 which were polishing methods outside the scope of the present invention, it was confirmed that a sufficient reduction effect could not be obtained for at least one of the number of defects and the haze of the silicon wafer.

TABLE 1

Composition of each polishing composition

| Polishing composition | Abrasive | | Basic compound | | HEC | | Water-soluble polymer | | | Surfactant | | | pH |
|---|---|---|---|---|---|---|---|---|---|---|---|---|---|
| | Type | Average primary particle size (nm) | Concentration (% by weight) | Type | Concentration (% by weight) | Mw | Concentration (% by weight) | Type | Mw | Concentration (% by weight) | Type | Mw | Concentration (% by weight) | |
| A | Silica 1 | 25 | 0.17 | NH₃ | 0.011 | None | 0 | PVA | 70000 | 0.004 | C-PEO | 400 | 0.0008 | 10.1 |
| | | | | | | | | PACMO | 350000 | 0.004 | | | | |
| B | Silica 1 | 25 | 0.18 | NH₃ | 0.005 | 280000 | 0.004 | PVP | 17000 | 0.003 | C-PEO | 400 | 0.0002 | 10.1 |
| C | Silica 2 | 35 | 0.95 | KOH | 0.065 | None | 0 | None | | 0 | None | | 0 | 10.5 |

TABLE 2

Characteristics of each polishing composition

| Polishing composition | Standard polishing removal rate (nm/min) | Standard haze parameter (relative value) | R1/R2 |
|---|---|---|---|
| A | 11 | 100 | 1.19 |
| B | 15 | 91 | 1.27 |
| C | 164 | Unmeasured | 1.00 |

TABLE 3

Details of each polishing method and surface quality of silicon wafer after polishing by each polishing method

| | Preliminary polishing step $P_p$ | | Final polishing step $P_f$ | | | | Surface quality | | |
|---|---|---|---|---|---|---|---|---|---|
| | | | Polishing sub-step $P_{fp}$ | | Polishing sub-step $P_{ff}$ | | The number of defects | Haze | |
| Polishing method | Polishing composition | Polishing time $T_p$ (sec) | Polishing composition | Polishing time $T_{fp}$ (sec) | Polishing composition | Polishing time $T_{ff}$ (sec) | (relative value) | (relative value) | |
| 1 | C | 160 | A | 150 | B | 10 | 29 | 100 | The present invention |
| 2 | C | 160 | A | 130 | B | 30 | 44 | 100 | The present invention |
| 3 | C | 160 | Not performed | | A | 160 | 29 | 110 | Comparative Example |
| 4 | C | 160 | Not performed | | B | 160 | 100 | 100 | Comparative Example |
| 5 | C | 160 | B | 150 | A | 10 | 100 | 110 | Comparative Example |

The present application is based on the Japanese patent application Nos. 2019-061177 and 2019-061187, filed on Mar. 27, 2019, and disclosed contents thereof are incorporated herein as a whole by reference.

The invention claimed is:

1. A method of polishing an object to be polished containing a material having a silicon-silicon bond, the polishing method comprising a final polishing step $P_f$,
   wherein the final polishing step Pf has a plurality of polishing sub-steps,
   the plurality of polishing sub-steps are continuously performed on the same polishing platen,
   a final polishing sub-step in the plurality of polishing sub-steps is a polishing sub-step $P_{ff}$ of polishing using a polishing composition $S_{ff}$,
   a polishing sub-step provided before the polishing sub-step $P_{ff}$ in the plurality of polishing sub-steps is a polishing sub-step $P_{fp}$ of polishing using a polishing composition $S_{fp}$, and
   the polishing composition $S_{ff}$ satisfies at least one of the following condition (A) or the following condition (B):
   condition (A): a value of a haze parameter of the polishing composition $S_{ff}$ obtained in a standard test 1 is smaller than a value of the haze parameter of the polishing composition $S_{fp}$ obtained in the standard test 1, and
   condition (B): the polishing composition $S_{ff}$ contains an abrasive $A_{ff}$, a basic compound $B_{ff}$, and hydroxyethyl cellulose; and
   wherein the method satisfies at least one selected from the group consisting of (a), (b), and (c):
   (a) $R1_{fp}/R2_{fp}$ is 1.25 or less, wherein:
      $R1_{fp}$, is D90 of particles present in the polishing composition $S_{fp}$, measured by a dynamic light scattering method; and
      $R2_{fp}$ is D90 of the particles present in the polishing composition $S_{fp}$ after adjusting the pH to 12.5 using potassium hydroxide and stirring for 30 minutes, measured by the dynamic light scattering method;
   (b) $R1_{ff}/R2_{ff}$ is more than 1.25, wherein:
      $R1_{ff}$ is D90 of particles present in the polishing composition $S_{ff}$, measured by the dynamic light scattering method; and
      $R2_{ff}$ is D90 of the particles present in the polishing composition $S_{ff}$ after adjusting the pH to 12.5 using potassium hydroxide and stirring for 30 minutes, measured by the dynamic light scattering method; and
   (c) the polishing method further comprises a preliminary polishing step $P_p$ before the final polishing step $P_f$, wherein:
      the preliminary polishing step $P_p$ is a step of polishing using the polishing composition $S_p$ in which a polishing removal rate obtained in a standard test 2 is 50 nm/min or more;
      the final polishing step $P_f$ is a step of polishing using the polishing composition $S_f$ in which the polishing removal rate obtained in the standard test 2 is more than 0 nm/min and less than 50 nm/min; and
      both the polishing composition $S_{ff}$ and the polishing composition SI correspond to the polishing composition Sf, and
      $R1_p/R2_p$ is 1.25 or less, wherein:
         $R1_p$ is D90 of particles present in the polishing composition Sp, measured by the dynamic light scattering method; and
         $R2_p$ is D90 of the particles present in the polishing composition $S_p$ after adjusting the pH to 12.5 using potassium hydroxide and stirring for 30 minutes, measured by the dynamic light scattering method.

2. The polishing method according to claim 1, wherein the polishing composition $S_{fp}$ contains an abrasive $A_{fp}$ and a basic compound $B_{fp}$.

3. The polishing method according to claim 2, wherein an average primary particle diameter of the abrasive $A_{fp}$ is 5 nm or more and less than 35 nm.

4. The polishing method according to claim 1, wherein the polishing composition $S_{fp}$ contains substantially no hydroxyethyl cellulose.

5. The polishing method according to claim 1, wherein in the condition (A), the polishing composition $S_{ff}$ contains the abrasive $A_{ff}$ and the basic compound $B_{ff}$.

6. The polishing method according to claim 5, wherein in the condition (A), the average primary particle diameter of the abrasive $A_{ff}$ is 5 nm or more and less than 35 nm.

7. The polishing method according to claim 1, wherein in the condition (B), the average primary particle diameter of the abrasive $A_{ff}$ is 5 nm or more and less than 35 nm.

8. The polishing method according to claim 1, wherein a polishing time of the polishing sub-step $P_{ff}$ is more than 0 second and 80 seconds or less.

9. The polishing method according to claim 1, wherein the polishing time of the polishing sub-step $P_{fp}$ is 20 seconds or more and 450 seconds or less.

10. The polishing method according to claim 1, wherein the polishing composition $S_p$ contains an abrasive $A_p$ and a basic compound $B_p$.

11. The polishing method according to claim 1, further comprising an intermediate polishing step $P_i$ between the final polishing step $P_f$ and the preliminary polishing step $P_p$,
   wherein the intermediate polishing step $P_i$ is a step of polishing using a polishing composition $S_i$ in which the polishing removal rate obtained in the standard test 2 is more than 0 nm/min and less than 50 nm/min,
   the polishing composition $S_i$ contains an abrasive $A_i$ and a basic compound $B_i$ and contains substantially no hydroxyethyl cellulose,
   when D90 of the particles present in the polishing composition $S_i$, which is measured by the dynamic light scattering method, is $R1_i$, and
   D90 of the particles present in the polishing composition Si after adjusting the pH to 12.5 using potassium hydroxide and stirring for 30 minutes, which is measured by the dynamic light scattering method, is $R2_i$,
   $R1_i/R2_i$ is 1.25 or less.

12. The polishing method according to claim 11, wherein a total polishing time of the intermediate polishing step $P_i$ and the polishing sub-step $P_{fp}$ is 20 seconds or more and 450 seconds or less.

* * * * *